United States Patent [19]
Kanai et al.

[11] Patent Number: 6,165,692
[45] Date of Patent: Dec. 26, 2000

[54] METHOD FOR MANUFACTURING A SEMICONDUCTOR DEVICE AND AN EXPOSURE MASK USED THEREFOR

[75] Inventors: Hideki Kanai; Shinichi Ito, both of Yokohama, Japan

[73] Assignee: Kabushiki Kaisha Toshiba, Kawasaki, Japan

[21] Appl. No.: 08/914,090

[22] Filed: Aug. 19, 1997

[30] Foreign Application Priority Data

Aug. 22, 1996 [JP] Japan ................................. 8-221229

[51] Int. Cl.⁷ ............................................. G03C 5/00
[52] U.S. Cl. ..................... 430/311; 430/311; 430/322; 378/35
[58] Field of Search ................... 430/5, 311, 313, 430/322; 378/35

[56] References Cited

U.S. PATENT DOCUMENTS

| | | | |
|---|---|---|---|
| 5,045,417 | 9/1991 | Okamoto | 430/5 |
| 5,308,741 | 5/1994 | Kemp | 430/312 |
| 5,320,918 | 6/1994 | Raab et al. | 430/5 |
| 5,364,716 | 11/1994 | Nakagawa et al. | 430/5 |
| 5,418,092 | 5/1995 | Okamoto | 430/5 |
| 5,424,154 | 6/1995 | Borodovsky | 430/5 |
| 5,432,044 | 7/1995 | Shimizu | 430/269 |
| 5,705,299 | 1/1998 | Tew et al. | 430/5 |

FOREIGN PATENT DOCUMENTS

| | | |
|---|---|---|
| 4-127150 | 4/1992 | Japan . |
| 4-146617 | 5/1992 | Japan . |
| 4-343215 | 11/1992 | Japan . |

*Primary Examiner*—S. Rosasco
*Attorney, Agent, or Firm*—Oblon, Spivak, McClelland, Maier & Neustadt, P.C.

[57] ABSTRACT

A method for manufacturing a semiconductor device includes the steps of preparing an exposure mask in which repeat pattern portions obtained by repeatedly arranging the same pattern and non-repeat pattern portions are separately formed in a plurality of regions of one exposure mask and phase shifters for changing a phase of illumination light are provided in at least part of the repeat pattern portions, preparing a semiconductor wafer having a plurality of chip areas, aligning a pattern of one of the plurality of regions of the exposure mask with each of the plurality of chip areas on the semiconductor wafer, effecting an exposing process in an illuminating condition corresponding to the pattern of the above one region, aligning the pattern of a different one of the plurality of regions on the exposure mask with each of the plurality of chip areas on the semiconductor wafer, and effecting an exposing process in an illuminating condition corresponding to the pattern of the different one region, wherein the step of exposing the pattern of the different one of the plurality of regions on the exposure mask is repeatedly effected until the exposing process for all of the plurality of regions of the exposure mask is completed.

21 Claims, 16 Drawing Sheets

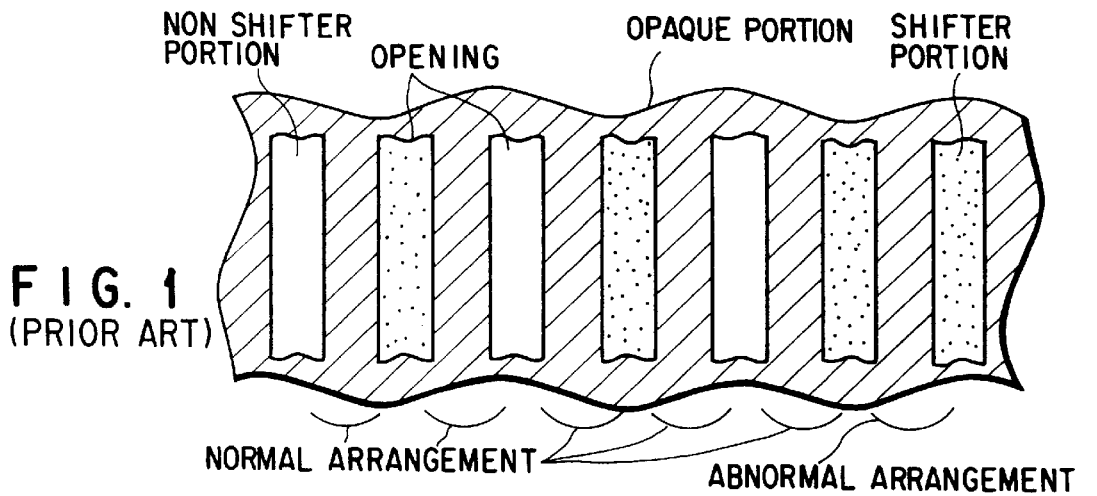
FIG. 1 (PRIOR ART)
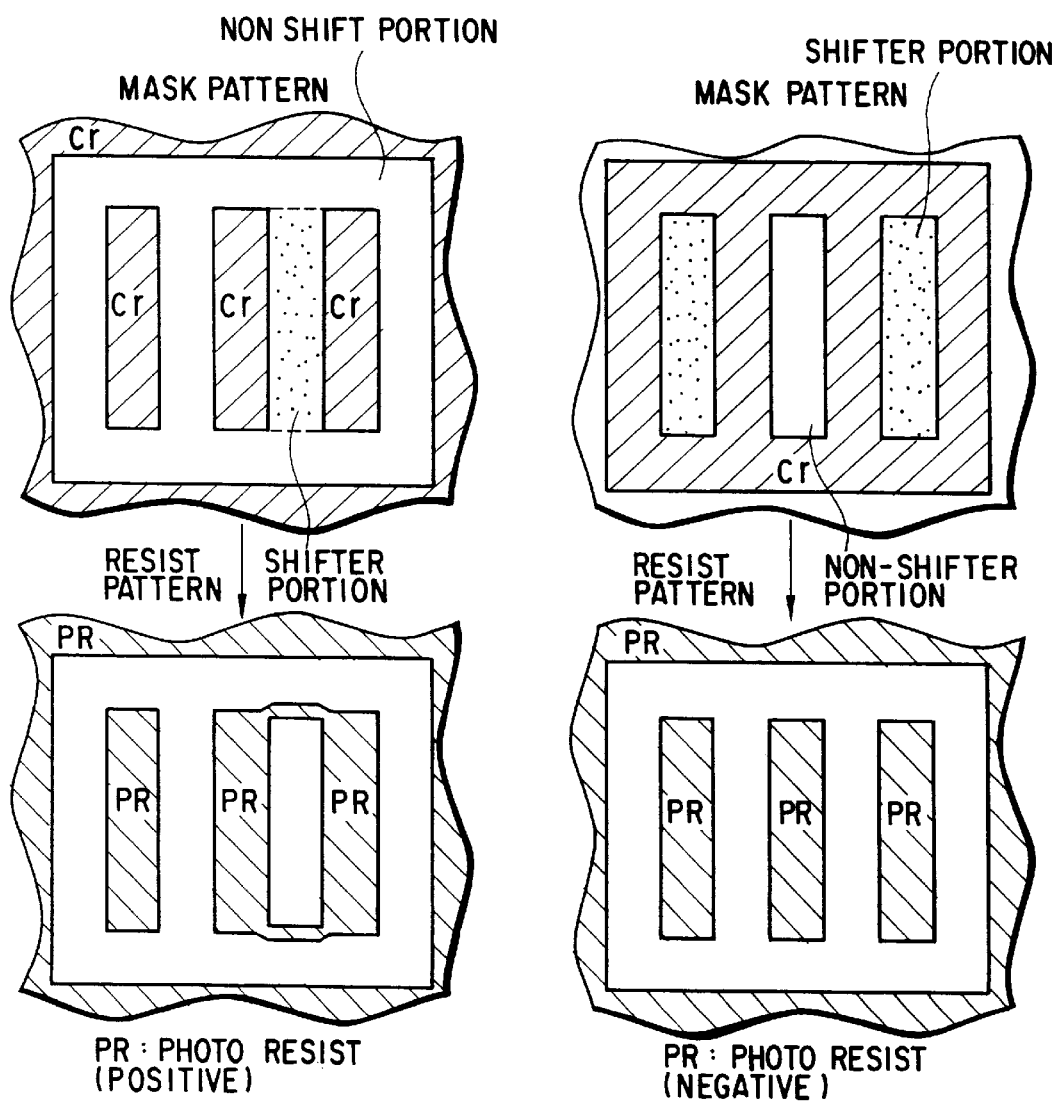
FIG. 2A (PRIOR ART)
FIG. 2B (PRIOR ART)

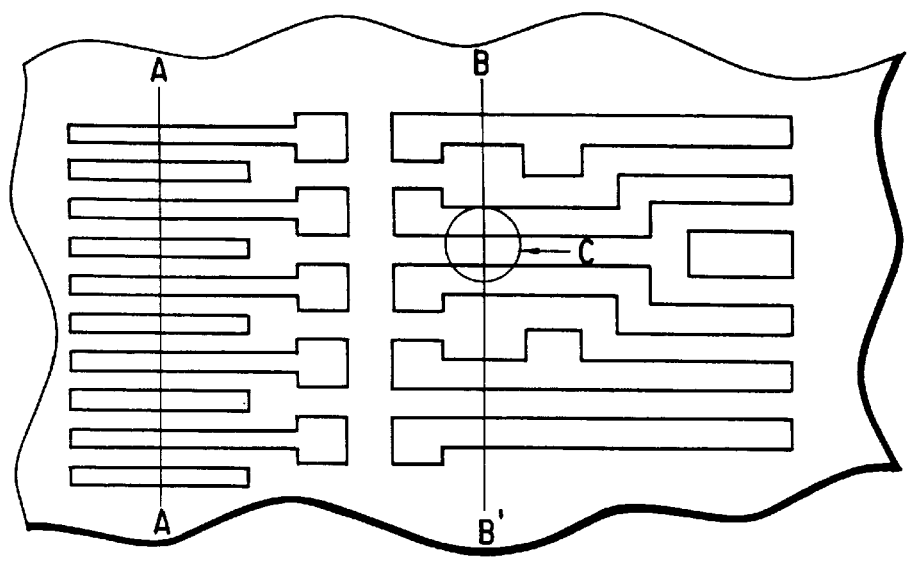
F I G. 9
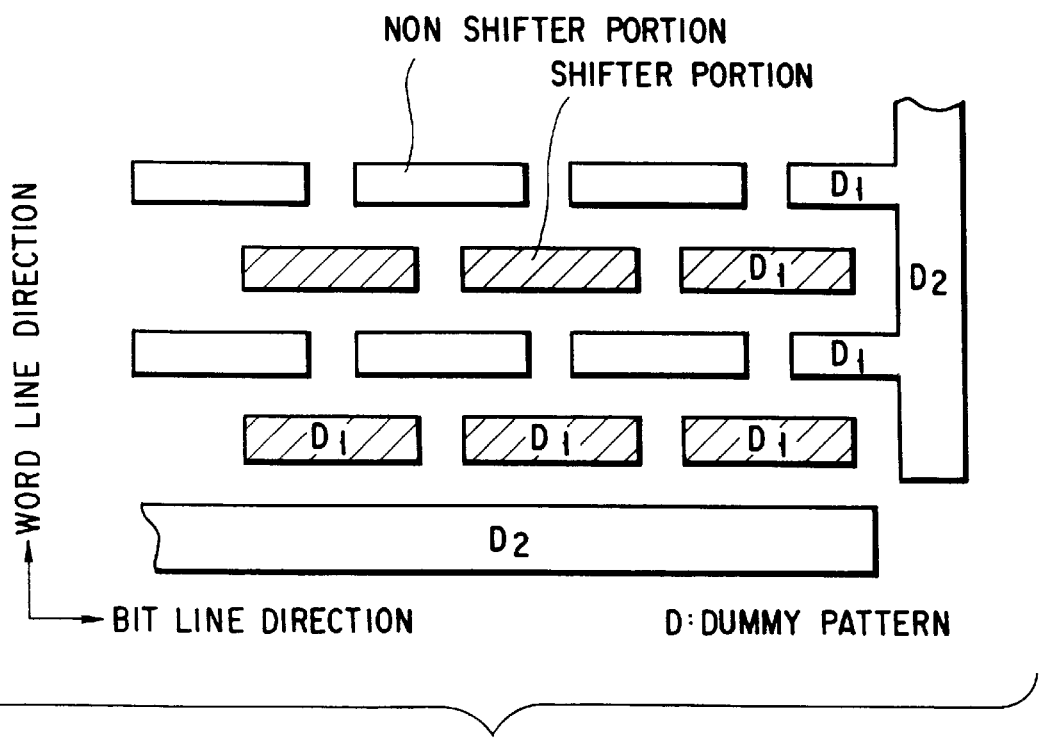
F I G. 14

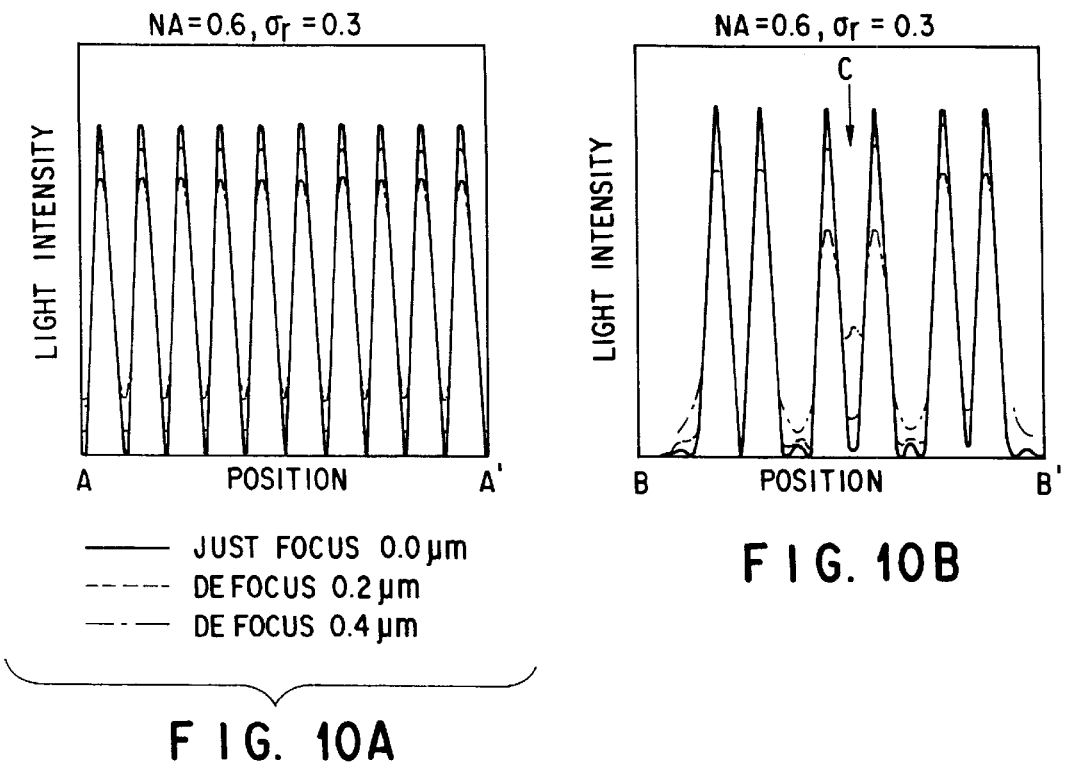
FIG. 10A
— JUST FOCUS 0.0 μm
--- DEFOCUS 0.2 μm
—·— DEFOCUS 0.4 μm
FIG. 10B
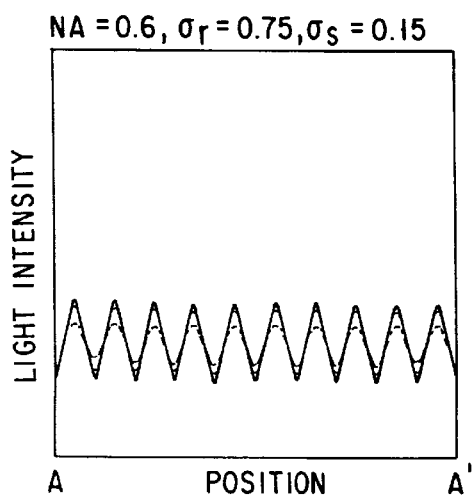
FIG. 11A
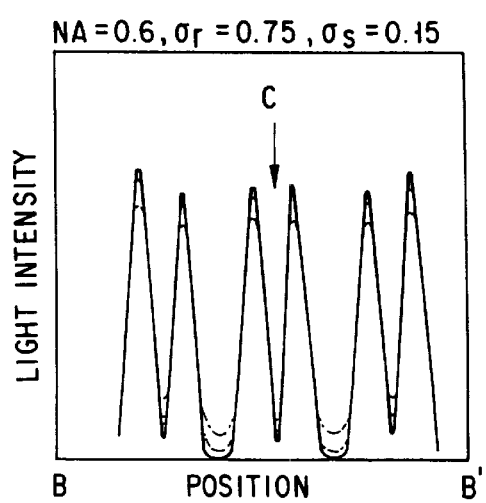
FIG. 11B

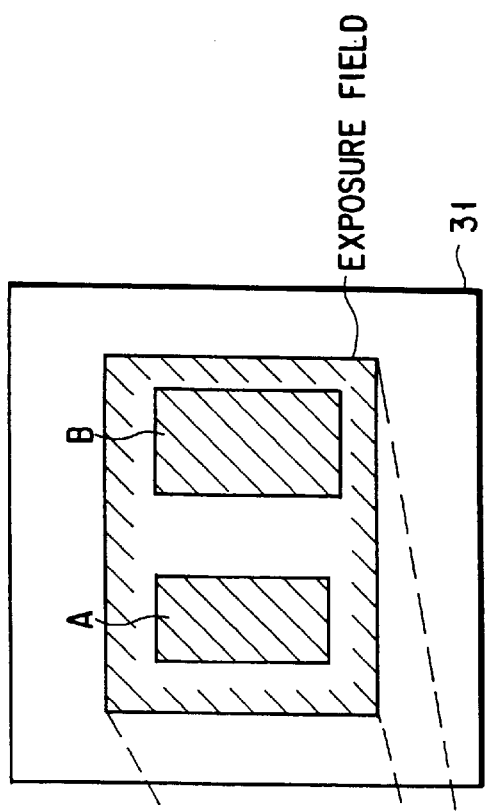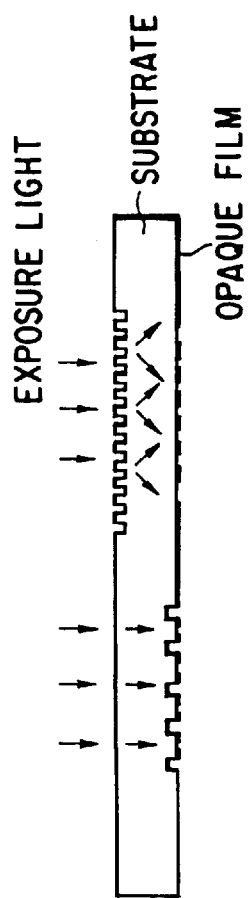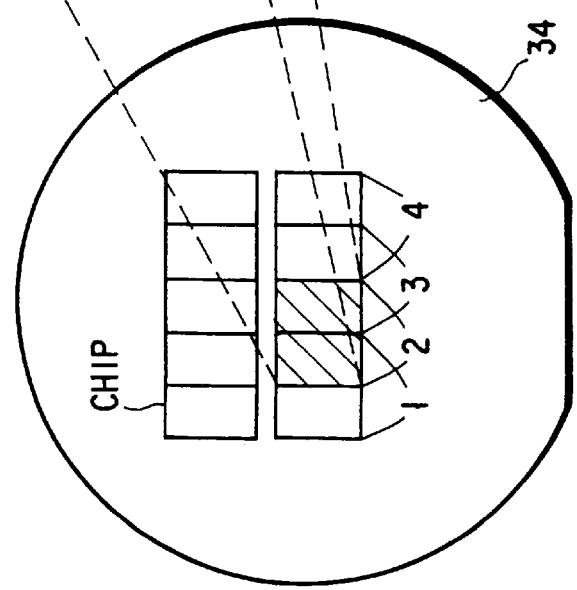

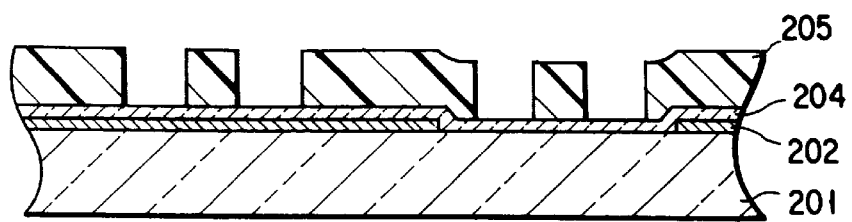
F I G. 23A
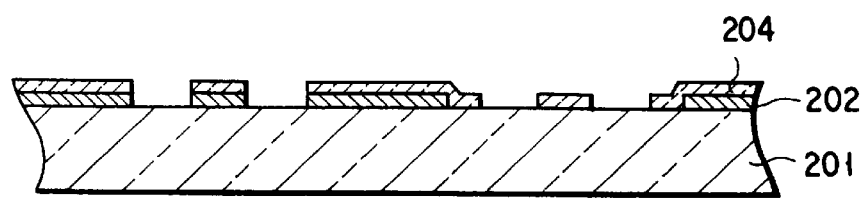
F I G. 23B
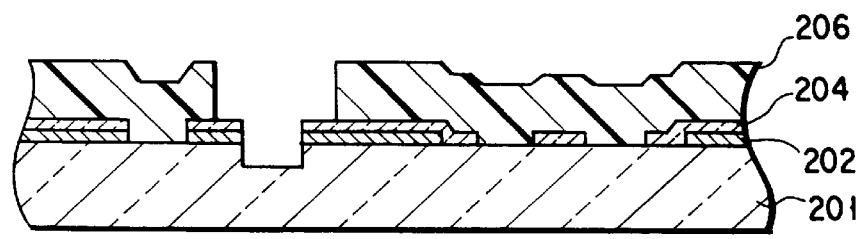
F I G. 23C
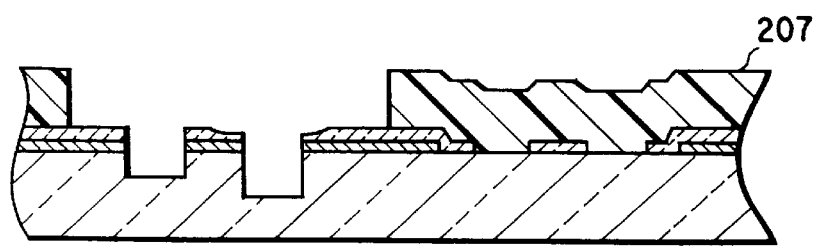
F I G. 23D
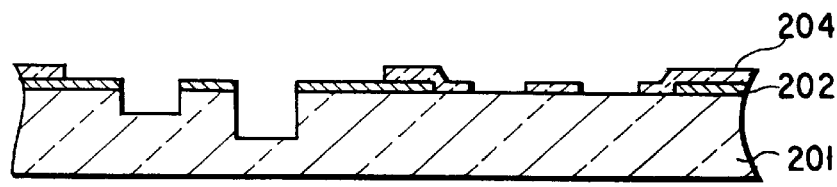
F I G. 23E

METHOD FOR MANUFACTURING A SEMICONDUCTOR DEVICE AND AN EXPOSURE MASK USED THEREFOR

BACKGROUND OF THE INVENTION

Recently, in a method for manufacturing a semiconductor device, the integration density of elements and wirings constructing circuits is increased and the pattern is further miniaturized. For example, in a DRAM which is a typical semiconductor memory device, it is said that it is required to form a pattern based on the design rule of 0.15 μm when a 1-Gbit DRAM is formed and it is required to form a pattern based on the design rule of 0.10 μm when a 4-Gbit DRAM is formed. In this case, the design rule can be considered equivalent to the minimum dimension of the line width.

As the pattern is increasingly miniaturized, the wavelength of light of the light source is shortened in the photolithography process for transferring a circuit pattern formed on the exposure mask onto a semiconductor substrate. When the design rule is set to a value of the order of quarter micron, the size of a pattern formed by use of a light source of g-line or i-line becomes smaller than the wavelength of the light, thereby making it difficult to form the pattern.

Therefore, a KrF (248 nm) or ArF (193 nm) laser is dominantly used as a light source. However, even if the above light source is used in the minute design rule for the 1-Gbit or 4-Gbit DRAM level, a lowering in the precision in a circuit pattern transferred onto the substrate becomes a serious problem. Specifically, light rays passing through apertures of an exposure mask which are adjacent to each other with an opaque region disposed therebetween interfere with and strengthen each other in the opaque region so as to lower the contrast of the light intensity projected on the substrate, thereby significantly degrading the pattern transfer precision.

As a method for solving the above problem, there is proposed a super resolution exposure method such as an off-axis illumination method or a phase shifting mask exposure method for improving the contrast of the projected light intensity by shifting the phase of the light passing through the exposure mask.

For example, the phase shifting method (M. D. Levenson et al. IEEE Trans. in Electron Devices, vol. ED-29, No. 12 (1982) p1828) using an alternating phase shifting mask and used as one of the super resolution exposure methods is to invert the phase of the light passing through the adjacent apertures with the opaque region disposed therebetween by 180 degrees and cause the light rays passing through the apertures to interfere with each other so as to enhance the contrast of the projected image between the two apertures.

An attenuated phase shifting mask includes an attenuated mask having a transmission which is approximately 2 to 15% instead of the opaque portion and causes a phase difference of 180 degrees between the light passing through the attenuated film and the light passing through the aperture. The light passing through the attenuated film interferes with the light passing through the aperture to improve the contrast of the projected image. The off-axis illumination method is a method for illuminating the exposure mask in an oblique direction with respect to the optical axis and adjusting the interference between the diffracted light rays passing through the pattern to improve the contrast.

A method using the alternating phase shifting mask is most effective among the super resolution exposure methods when a pattern having a regularity in the configuration and frequently used for a memory cell array is formed. However, this type of alternating phase shifting mask has the following problems (1) to (3).

(1) The alternating phase shifting mask can be effectively used and provide high performance for a regularly arranged pattern such as a memory cell array, but if the regularity of the pattern is lost, it becomes impossible to alternately attach shifters. For example, as shown in FIG. 1, the arrangement in which the phase difference between adjacent apertures with an opaque portion disposed therebetween is approximately 180 degrees is referred to as a normal arrangement and the arrangement in which the phase difference between adjacent apertures is 0 degree is referred to as an abnormal arrangement. Of course, the resolution and the pattern transfer precision are low in a portion of the abnormal arrangement, that is, in a portion wherein a normal phase difference of 180 degrees is not set in comparison with a region of the normal arrangement.

In a memory cell array of a semiconductor memory device having an integration density higher than the integration density of a 1-Gbit DRAM, a line pattern whose line width is smaller than 0.18 μm is present, and in a peripheral circuit adjacent to the memory cell array, a pattern whose design rule is larger than the design rule in the memory cell array but is equal to or smaller than 0.25 μm is present.

A case wherein phase shifters are arranged in a bit line pattern is considered. In this case, since the patterns in the memory cell array are regularly (repetitively) arranged, the entire arrangement is a normal arrangement and the performance of the alternating phase shifting mask can be fully attained. However, in a sense in the amplifier portion, a pattern of abnormal arrangement lies. In the pattern of abnormal arrangement, the pattern transfer precision is low in comparison with the normal arrangement portion. That is, in a pattern to which shifters cannot be regularly attached, it is impossible to enhance the resolution by use of the alternating phase shifting mask.

The pattern layout is determined by the device structure, and even if the pattern layout is modified to form the entire arrangement in the form of a normal arrangement, the modification is limited by the design and structure of the device. Therefore, it is impossible to determine the pattern layout so as to set the entire arrangement of every adjacent apertures in the normal arrangement form while putting much importance on the performance of resolution.

Further, as is disclosed in Jpn. Pat. Appln. KOKOKU Publication No. 62-59296, in the alternating phase shifting mask, the performance of resolution can be fully attained if the coherency σ of the exposure optical system is lower. However, in order to separate and resolve a portion of the abnormal arrangement, that is, a portion in which a normal phase difference of 180 degrees is not obtained, it is desired to increase the coherency σ.

For example, it is desirable to set σ to 0.3 or less in order to attain the optimum performance of resolution of the fine pattern of 0.18 μm or less in the memory cell array. However, it is difficult to resolve a pattern in a region other than the memory cell array in the illuminating condition of σ=0.3 and it is desirable to set σ equal to or larger than 0.5. That is, if the illuminating condition adequate for a region of the memory cell array is selected, the resolution in a region other than the memory cell array is lowered, and if the illuminating condition adequate for a region other than the memory cell array is selected, the resolution in a region of the memory cell array is lowered.

(2) In a group of patterns regularly arranged in a memory cell array, for example, the light intensity and contrast of a projected image of the pattern disposed at the end portion of the regular arrangement are lowered.

The above phenomenon occurs because at least two apertures which are adjacent to each other in the regular arrangement direction with a relative phase difference of approximately 180 degrees are present in the pattern inside the group of patterns regularly arranged, but only one aperture is present in the pattern disposed at the end portion of the regular arrangement. Therefore, the interference occurring between the adjacent apertures is not sufficiently strong, thereby lowering the resolution.

For example, in a bit line forming pattern, a lowering in the light intensity is significant in the pattern disposed at the end portion of the regular arrangement. In a case where a negative resist is used for transferring the alternating phase shifting mask, the pattern cannot be formed and residue is left behind if the light intensity is low. The resist residue may cause a defect when the background is etched by using a formed resist pattern as an etching mask in the semiconductor device forming process. For example, a defect of the device such as a short circuit of wirings may be caused, thereby lowering the manufacturing yield.

Further, in a rectangular pattern for forming element regions, a lowering in the light intensity is significant in the end portion of the regular arrangement in the short-side direction. In the long-side direction, the front end portion of the rectangular pattern obtained after transferring becomes thin. Therefore, a sufficiently high transfer precision cannot be attained.

(3) In the alternating phase shifting mask, it is necessary to attach a shifter to an aperture pattern surrounded by an opaque film. Therefore, in order to resolve a line pattern or the like, it is necessary to use a negative resist.

For example, a case wherein it is desired to form an island-form resist pattern is explained with reference to FIGS. 2A and 2B. FIG. 2A shows a case wherein island-form patterns are formed by use of a positive resist. In this example, the opaque patterns (Cr) are formed in an island form and a shifter portion is set in contact with the end portion of the opaque film. In the aperture portion, the shifter portion (phase difference of 180 degrees) and a non-shifter portion (phase difference of 0 degree) are directly adjacent to each other and the light intensity of a projected image in the boundary portion is lowered by the interference. As a result, resist patterns (PR) are formed in such a form that portions thereof corresponding to the boundary portions are connected to each other (FIG. 2A). Therefore, it becomes necessary to provide a phase shifter in the aperture portion surrounded by the opaque film as shown in FIG. 2B and form island-form resist patterns by use of a negative resist.

However, the negative resist has a defect that the resolution thereof is lower in comparison with that of the positive resist. According to the evaluation by the inventors, the depth of focus of 0.2 to 0.6 μm was obtained when a negative resist was used for a line-and-space pattern of 0.25 μm and the depth of focus of 1.0 μm or more was obtained when a positive resist was used. That is, the negative resist is extremely inferior to the positive resist in the depth of focus. Thus, the optical image quality can be enhanced by use of the alternating phase shifting mask, but since the resist performance thereof is low, the performance thereof cannot be fully utilized.

Further, the above problem occurs not only in the semiconductor memory device but also in a semiconductor device having a regularly arranged pattern and another pattern.

BRIEF SUMMARY OF THE INVENTION

An object of this invention is to provide a method for manufacturing a semiconductor device in which optimum illuminating conditions can be respectively set for a regularly arranged pattern portion (repeat pattern) and another pattern portion (non-repeat pattern) and the performance of resolution can be enhanced.

Further, another object of this invention is to provide a method for manufacturing a semiconductor device in which a lowering in the light intensity and contrast of a projected image in the end portion of the regular arrangement of a group of regularly arranged patterns can be prevented and the device reliability can be enhanced.

Further, another object of this invention is to provide a method for manufacturing a semiconductor device in which island-form patterns can be resolved by use of a positive resist by using an alternating phase shifting mask and the performance of the alternating phase shifting mask can be fully attained.

Further, another object of this invention is to provide an exposure mask used for each of the above methods.

In order to attain the above objects, a method for manufacturing a semiconductor device according to a first aspect of this invention comprises the steps of preparing an exposure mask in which repeat pattern portions obtained by repeatedly arranging the same pattern and non-repeat pattern portions are separately formed in a plurality of regions of one exposure mask and phase shifters for changing a phase of illumination, light are provided in at least part of the repeat pattern portions; preparing a semiconductor wafer having a plurality of chip areas; aligning a pattern of one of the plurality of regions of the exposure mask with each of the plurality of chip areas on the semiconductor wafer; effecting an exposing process in an illuminating condition corresponding to the pattern on the one region; aligning a pattern of a different one of the plurality of regions on the exposure mask with each of the plurality of chip areas on the semi-conductor wafer; and effecting an exposure process in an illuminating condition corresponding to the pattern of the different one region, wherein the step of effecting an exposing process corresponding to the pattern of the different one of the plurality of regions on the exposure mask is repeatedly effected until the exposure process for all of the plurality of regions of the exposure mask is completed.

The method for manufacturing a semiconductor device according to the first aspect comprises a step of aligning a pattern of a different one of the plurality of regions on the exposure mask with one of the chip areas on the semiconductor wafer and effecting the exposure process in an illuminating condition corresponding to the pattern of the different region; wherein the step of exposing the pattern of the different one of the plurality of regions on the exposure mask may be repeatedly effected until the operation of exposing all of the plurality of regions of the exposure mask for the above one of the plurality of chip areas is completed and then the exposure operation cycle may be sequentially repeated for the plurality of chip areas.

In the above manufacturing method, the plurality of regions is two regions, the step of exposing the pattern on the above one region may include a step of exposing one of the plurality of chip areas, and the step of exposing the different region may include a step of exposing the above one of the plurality of chip areas after the step of exposing the pattern of the above one region.

Further, it is preferable that the repeat pattern portion includes a memory cell region and the non-repeat pattern portion includes a sense amplifier region.

Also, it is preferable that the non-repeat pattern portions are formed in a translucent layer formed on a transparent substrate having a plurality of opening portions formed therein, each of the plurality of opening portions being combined with an adjacent portion of the translucent layer to constitute a phase shifter for substantially inverting the phase of the illumination light passing therethrough.

According to the first aspect of this invention, the repeat patterns and the non-repeat patterns are separately formed on a plurality of different regions of one exposure mask and the exposure performances of the two pattern portions can be enhanced by exposing each of the regions in an illuminating condition adequate for each pattern.

Further, the exposure performance can be further enhanced by forming the repeat pattern portion by use of an alternating phase shifting mask and forming the non-repeat pattern portion by use of an attenuated phase shifting mask, for example. In the attenuated shifting mask, since a pattern of the attenuated film is formed instead of the opaque film pattern, no restriction is given by the pattern arrangement unlike the case of the alternating phase shifting mask.

Therefore, the pattern transfer precision can be enhanced in the pattern of the peripheral circuit by adequately selecting the illuminating condition and the condition of the exposure mask effective for each pattern. In this case, the illuminating condition includes conditions for setting the numerical aperture NA of the projecting optical system, the shape of a secondary light source and the amount of exposure light for forming a pattern of desired size.

In the above explanation, the non-repeat pattern is formed by use of an attenuated phase shifting mask, but this is not limitative and the performance of resolution can be enhanced by using the off-axis illumination method even when a normal mask is used. That is, it is important to set different illuminating conditions. Further, it is possible to form both of the repeat pattern portions and the non-repeat pattern portions by use of an attenuated phase shifting mask and set different conditions of the off-axis illumination. For example, since the optimum illuminating condition changes when the pattern size, the arrangement or the like is changed, this invention can be applied even when the attenuated shifting mask is used for forming both of the pattern portions.

A method for manufacturing a semiconductor device according to a second aspect of this invention comprises the steps of preparing a plurality of first exposure masks having repeat pattern portions obtained by repeatedly arranging the same pattern and a plurality of second exposure masks having non-repeat pattern portions, phase shifters for changing a phase of illumination light being provided in at least part of the repeat pattern portions; preparing a plurality of semiconductor wafers each having a plurality of chip areas; sequentially aligning one pattern in the plurality of first exposure masks with the plurality of chip areas on the plurality of semiconductor wafers; exposing the pattern in the plurality of the first exposure masks in an illuminating condition corresponding to the pattern; sequentially aligning one pattern in the plurality of second exposure masks with the plurality of chip areas on the plurality of a semiconductor wafers; and exposing the pattern in the plurality of second exposure masks in an illuminating condition corresponding to the pattern; wherein the step of exposing the pattern in the plurality of first exposure masks and the step of exposing the pattern in the plurality of second exposure masks are repeatedly effected by the numbers of times respectively equal to the number of the first exposure masks and the number of the second exposure masks.

It is preferable that the repeat pattern portion includes a memory cell region and the non-repeat pattern portion includes a sense amplifier region.

It is preferable that the non-repeat pattern portions are formed in a translucent layer formed on a transparent substrate having a plurality of opening portions formed therein, each of the plurality of opening portions being combined with an adjacent portion of the translucent layer to constitute a phase shifter for substantially inverting the phase of the illumination light passing therethrough.

The step of exposing the pattern in the plurality of first exposure masks may include a step of sequentially exposing the plurality of chip areas of one of the plurality of semiconductor wafers and then terminating an exposure cycle, and the step of exposing one pattern in the plurality of second exposure masks may include a step of sequentially exposing the plurality of chip areas of one of the plurality of semiconductor wafers and then terminating an exposure cycle.

The step of exposing the pattern in the plurality of first exposure masks may include a step of repeatedly effecting sub-cycles for sequentially exposing the plurality of chip areas of one of the plurality of semiconductor wafers by the number of times equal to the number of the semiconductor wafers and then terminating an exposure cycle, and the step of exposing the pattern in the plurality of second exposure masks may include a step of repeatedly effecting sub-cycles for sequentially exposing the plurality of chip areas of one of the plurality of semiconductor wafers by the number of times equal to the number of the semiconductor wafers and then terminating an exposure cycle.

The step of exposing the pattern in the plurality of the first exposure masks and the step of exposing the pattern in the plurality of the second exposure masks may be continuously effected for each of the plurality of chip areas by the number of the plurality of the first exposure masks and the number of the plurality of the second exposure masks.

Like the first aspect, according to the second aspect of this invention, the performance of resolution can be enhanced for both of the repeat pattern portion and the non-repeat pattern portion by exposing the repeat pattern portion and the non-repeat pattern portion in different illuminating conditions. In this case, the exposure operations in the different illuminating conditions can be attained by separately forming the repeat pattern portion and the adjacent non-repeat pattern portion in a plurality of exposure masks, aligning them on the substrate and effecting the superposed exposure operation in the different illuminating conditions.

In the method of manufacturing a semiconductor device according to the first and second aspects of this invention, it is preferable that the in-plane intensity distribution of the secondary light source for illuminating the exposure mask is set such that at least two local areas lying in a position deviated from the optical axis become larger than an area lying near the optical axis and a pattern other than the cell array is exposed by use of an illumination aperture for limiting a distance σr between the optical axis and the center of the local area and the radius σs of the local area to satisfy the following conditions when the radius of the pupil of the projecting optical system is set to 1.

$$0.6 \leq \sigma r \leq 0.9$$

$$0.15 \leq \sigma s \leq 0.3$$

Alternatively, in the manufacturing method according to the first and second aspects, it is preferable that the in-plane intensity distribution of the secondary light source for illuminating the exposure mask is set such that an annular local area having a center lying on the optical axis becomes larger than an area lying near the optical axis and a pattern other than the cell array is exposed by use of an illumination aperture for limiting the outside radius σa of the annular area with respect to the optical axis and the ratio ε of the outside radius and inside radius to satisfy the following conditions when the radius of the pupil of the projecting optical system is set to 1.

$$0.6 \leq \sigma a \leq 0.9$$

$$0.5 \leq \epsilon \leq 0.75$$

A method for manufacturing a semiconductor device according to a third aspect of this invention comprises the steps of preparing a semiconductor wafer having a plurality of chip areas; preparing an exposure mask formed such that repeat pattern portions obtained by repeatedly arranging the same pattern and non-repeat pattern portions are projected on different ones of the plurality of chip areas on the semiconductor wafer, phase shifters for changing a phase of illumination light being provided in at least part of the repeat pattern portions and a diffraction grating pattern being provided in a region corresponding to the non-repeat pattern portions; and simultaneously exposing the repeat pattern portions and the non-repeat pattern portions of the exposure mask onto the different one of the plurality of chip areas of the semiconductor wafer; wherein the repeat pattern portions and the non-repeat pattern portions are exposed onto preset regions of substantially all of the plurality of chip areas by repeatedly effecting the exposure step so as to expose the repeat pattern portions onto substantially all of the plurality of chip areas.

It is preferable that the repeat pattern portion includes a memory cell region and the non-repeat pattern portion includes a sense amplifier region.

According to the third aspect of this invention, the substantial illuminating condition can be changed by properly designing the exposure mask (for example, a mask described in claim 17) without directly changing the illuminating condition, and as a result, like the first aspect, the performance of resolution for both of the repeat pattern portion and the non-repeat pattern portion can be enhanced.

An exposure mask according to a fourth aspect of this invention which is an exposure mask used for projecting a pattern onto a plurality of chip areas on a semiconductor wafer comprises a transparent substrate; an opaque film having a plurality of opening portions and formed on the transparent substrate; a repeat pattern portion which is formed of the plurality of opening portions in a preset region on the transparent substrate and in which the same pattern is repeatedly arranged; a non-repeat pattern portion which is formed of the plurality of opening portions in a region other than the preset region on the transparent substrate; phase shifters formed in at least part of the repeat pattern portion, for changing the phase of illumination light; and a diffraction grating pattern formed on a surface of the transparent substrate which faces a surface on which the opaque film of the non-repeat pattern portion is formed.

An exposure mask according to a fifth aspect of this invention which is an exposure mask used for projecting a pattern onto a plurality of chip areas on a semiconductor wafer comprises a transparent substrate; an opaque film having a plurality of opening portions and formed on the transparent substrate; a repeat pattern portion which is formed of the plurality of opening portions in a preset region on the transparent substrate and in which the same pattern is repeatedly arranged; a first dummy pattern formed of the same pattern in position adjacent to the repeat pattern portion on the transparent substrate, the first dummy pattern being independent of a function of a semiconductor element; and a second dummy pattern which is larger than the first dummy pattern and is formed in position opposite to the first dummy pattern with the repeat pattern portion disposed therebetween.

According to the fifth aspect of this invention, the light intensity of a projected image of the first dummy pattern is made higher than that of the cell pattern by forming the pattern at the end of the regular arrangement as a dummy pattern (first dummy pattern) and forming the second dummy pattern which is larger than the first dummy pattern outside the first dummy pattern, but the light intensity of the projected image in the memory cell portion becomes constant. Therefore, even when a negative resist is used, a reduction in the width of the tip end portion of the resist pattern and occurrence of the residue thereof can be previously prevented.

A method for manufacturing a semiconductor device according to a sixth aspect of this invention comprises the steps of preparing an exposure mask in which a plurality of island-form opening patterns are regularly arranged and an optical path difference of approximately ½ of a wavelength λ of an exposure light is provided for each of adjacent opening patterns; forming a semiconductor element on a semiconductor substrate; forming an insulating film on the semiconductor substrate having the semiconductor element formed thereon; forming a positive resist layer on the insulating film; exposing the resist layer via a pattern of the exposure mask and developing the same to form a resist pattern; selectively etching the insulating film to form trenches by using the resist pattern as a mask; and filling a wiring material in the trenches of the insulating film.

According to the sixth aspect of this invention, a pattern can be formed by use of the alternating phase shifting mask and positive resist by adequately designing the film forming process or etching process. Therefore, the precision of pattern transfer in the case of using the alternating phase shifting mask can be further enhanced.

A method for forming an exposure mask according to a seventh aspect of this invention comprises the steps of forming an opaque film on a transparent substrate; forming an opening pattern in the opaque film in position corresponding to a non-repeat pattern portion different from a repeat pattern portion in which the same pattern is repeatedly arranged; forming an attenuated film on an entire surface; forming a preset resist pattern on the attenuated film lying on a region in which the opening pattern of the opaque film is formed and forming an opening pattern of the resist on the attenuated film lying on the opaque film in position corresponding to the repeat pattern portion; etching exposed portions of the attenuated film; removing the resist, coating a resist again, and forming a preset opening pattern on the opaque film in position of the repeat pattern portion; etching exposed portions of the opaque film; removing the resist, coating a resist again, and forming a resist opening in part of the opening pattern of the opaque film; and etching exposed portions of the transparent substrate by a preset amount.

Alternatively, the method for forming an exposure mask may comprise the steps of forming an opaque film on a transparent substrate; forming an opening pattern in the opaque film in position corresponding to a non-repeat pattern portion different from a repeat pattern portion in which the same pattern is repeatedly arranged; forming an attenuated film on an entire surface; forming a preset resist pattern on the attenuated film lying on a region in which the opening pattern of the opaque film is formed and forming a preset resist pattern on the attenuated film lying on the opaque film in position corresponding to the repeat pattern portion; etching exposed portions of the attenuated film; etching the opaque film exposed; removing the resist, coating a resist again, and forming a resist opening in part of the opening pattern of the attenuated film and the opaque film in position corresponding to the repeat pattern portion; and etching the transparent substrate exposed by a preset amount.

The objective of this invention is described more in detail.

According to the first and second aspects of this invention, the exposure performance can be enhanced in both of the repeat pattern portion and the non-repeat pattern portion. For example, in a case where patterns (repeat pattern) in the cell array are regularly arranged as shown in FIG. 3, it is possible to set the phase difference between the adjacent opening portions to 180 degrees in all of the patterns. However, in the non-repeat pattern (for example, sense amplifier) different from the cell array, the phase differences in all of the patterns cannot be set to 180 degrees (normal arrangement) and occurrence of the abnormal arrangement cannot be prevented.

In a pattern other than the cell array, for example, when the distance between the openings of 0 degree is 0.25 $\mu$m or less, preferable resolution cannot be expected in the exposing condition of $\sigma=0.3$. This is because the contrast of the light intensity profile on the substrate corresponding to the pattern of the abnormal arrangement is low as shown in FIG. 10B. Therefore, a design is made to effect the exposure operation in the optimum illuminating conditions for the patterns of the sense amplifier portion and the cell array. Then, it becomes possible to enhance the performance of resolution in both of the cell array and the sense amplifier portion.

The exposure operations under different optimum illuminating conditions can be attained by separately forming the patterns of the cell array and an adjacent peripheral circuit on different regions of one exposure mask, aligning them on the substrate and effecting the superposed exposure operation in the different exposing conditions. Unlike the other multiplex exposing methods, in this invention, it is not necessary to prepare an exclusive-use pattern for each exposure.

For easy understanding of this invention, a superposed exposure method which is known in the art is explained.

In Jpn. Pat. Appln. KOKAI Publication No. 4-146617, a method for forming an independent pattern by use of an alternating phase shifting method is disclosed. A first pattern having a regularity in its configuration and formed as the alternating phase shifting mask and a second pattern for canceling an unwanted pattern other than the desired independent pattern among the regularly arranged pattern are formed on one exposure mask or a plurality of exposure masks and subjected to the superposed exposure process.

Thus, the above technique is basically different from this invention which is intended to attain the sufficiently high resolution performance for each pattern by changing the illuminating condition for each pattern. Further, with the above method, it is necessary to prepare the second pattern for canceling the unwanted pattern.

In Jpn. Pat. Appln. KOKAI Publication No. 4-127150, another example of the superposed exposure method is proposed. That is, a first pattern and a second pattern are separately formed on one exposure mask or a plurality of exposure masks and subjected to the superposed exposure process by use of light ray having a phase difference. In other words, the purpose of the above proposal is to provide a phase shifting effect by use of an exposure device without forming a shifter on the exposure mask. The illuminating condition such as $\sigma$ except the illuminating condition for providing a phase difference for the patterns on the exposure mask is kept unchanged. This is because the same illuminating condition must be set in order to provide the phase shifting effect. Therefore, this method cannot solve the problem (1) described in the related art.

Since the objective of this invention is to provide a sufficiently high resolution performance for each pattern by changing the illuminating condition for each pattern, this invention is basically different from the above proposal. For example, in a pattern shown in FIG. 9, the light intensity of a projected image obtained when the alternating phase shifting mask is exposed by use of an aperture of $\sigma=0.3$ is shown in FIGS. 10A and 10B, and the light intensity of a projected image obtained, when a normal mask is exposed by use of an aperture having four main portions with a radius $\sigma s$ at a distance of $\sigma r$ from the optical axis in a direction at an angle of 45 degrees with respect to the line-and-space pattern on the exposure mask with the optical axis set as a center as shown in FIG. 8C, is shown in FIGS. 11A and 11B. In this case, if the radius of the pupil is set to 1, $\sigma r$ is set to 0.75 and $\sigma s$ is set to 0.15.

Each of the patterns of the cell array and the peripheral circuit thereof, in this example, the sense amplifier portion can be resolved with the pattern transfer precision which is high enough to form a device by separately forming the patterns and setting different illuminating conditions for the patterns. Further, the exposure performance can be enhanced by forming the pattern other than the pattern for the cell array by use of an attenuated phase shifting mask. In the attenuated shifting mask, since a pattern of attenuated film is formed instead of an opaque film pattern, no restriction is given by the pattern arrangement unlike the case of the alternating phase shifting mask.

Therefore, the pattern transfer precision in the pattern of the peripheral circuit can be enhanced by adequately selecting the illuminating condition and the condition of the exposure mask effective for each pattern. In this case, the illuminating condition includes conditions for setting the numerical aperture NA of the projecting optical system, the shape of a secondary light source and the amount of exposure light for forming a pattern of desired size.

Next, an exposure sequence in the first and second aspects of this invention is explained below.

Generally, in the process of manufacturing a semiconductor device, a plurality of chips of semiconductor devices are formed on one substrate based on the step and repeat system by use of an exposure device called a stepper. In the manufacturing process, a plurality of substrates are dealt with as one unit (one lot). Therefore, semiconductor device chips of a number equal to the number of chips x the number of substrates can be simultaneously obtained. On the substrate, constituents of the device are previously formed and an alignment mark for alignment is also formed. In the manufacturing process, the alignment mark is detected and the semiconductor device chips are aligned and subjected to the exposure process.

The exposure sequence in the first and second aspects corresponds to the following three methods.

(1) The pattern in one of separately formed regions is aligned according to the chip arrangement of the semiconductor device previously formed on the substrate and then subjected to the exposing process, a next exposing region is selected, and the pattern in the region is aligned according to the chip arrangement in the same manner as described above and then subjected to the superposed exposing process.

That is, after one pattern is transferred onto one substrate for all of the chips according to the chip arrangement, patterns in the other regions are sequentially subjected to the exposure process according to the chip arrangement.

(2) Immediately after the pattern in one of separately formed regions is aligned with one of the chips previously formed on the substrate and then subjected to the exposure process, a next exposure region is selected and the pattern in the region is transferred. This operation is repeatedly effected by a number of times corresponding to the number of separately formed regions. Next, the process up to the above step is repeatedly effected according to the chip arrangement while sequentially selecting one of the chips on the substrate.

That is, after patterns are transferred onto one chip by subjecting a plurality of patterns to the superposed exposure process, a next chip is sequentially formed.

(3) The pattern in one of separately formed regions is aligned according to the chip arrangement of the semiconductor device previously formed on the substrate and then subjected to the exposure process, the substrate is replaced by another substrate, and thus the exposure process is effected for a plurality of substrates. Then, the exposure region of the exposure mask is changed, the substrate is replaced again, and the pattern is sequentially aligned for a plurality of substrates according to the chip arrangement and then subjected to the superposed exposure process.

That is, after the pattern of one region is sequentially transferred onto a plurality of substrates of one unit, the substrate is replaced and the pattern in a different region is sequentially subjected to the exposure process.

A desired one of the above exposure sequences may be selected according to the precision of superposition of the exposure device and the manufacturing efficiency in the manufacturing process of the semiconductor device.

Like the first aspect of this invention, in the second aspect of this invention, the performance of resolution for both of the repeat pattern portion and the non-repeat pattern portion can be enhanced by exposing the repeat pattern portion and the non-repeat pattern portion under different illuminating conditions. The exposure process in the different illuminating conditions can be attained by separately forming the repeat pattern portion and the adjacent non-repeat pattern portion on a plurality of exposure masks, aligning the pattern portions on the substrate and subjecting the pattern portions to the superposed exposure process in the different exposing conditions.

The second aspect corresponds to the above exposure sequences (3), (1), (2). In this case, however, a plurality of exposure masks are selectively changed and the patterns formed on the exposure masks are subjected to the superposed exposure process without subjecting the patterns on different regions of one exposure mask to the superposed exposure process.

Like the first aspect, according to the third aspect of this invention, the performance of resolution for both of the repeat pattern portion and the non-repeat pattern portion can be enhanced by exposing the repeat pattern portion and the non-repeat pattern portion under different illuminating conditions.

Like the first and second aspects, in the third aspect, the performance of resolution for both of the repeat pattern portion and the non-repeat pattern portion can be enhanced by exposing the repeat pattern portion and the non-repeat pattern portion under different illuminating conditions. The third aspect is different from the first and second aspects in the method for changing the illuminating condition.

In the first and second aspects, the superposed exposure process is effected on the substrate after changing the illuminating condition in the exposing device, but in the third aspect, the substantial illuminating condition is changed by properly designing the exposure mask. That is, a diffraction grating is formed in a region the exposure mask corresponding to the peripheral circuit other than the cell array and on the surface (corresponding to the illuminated side when the exposure mask is mounted on the exposure device) of a substrate used for forming the exposure mask which is opposite to the surface thereof on which the pattern of the semiconductor device is formed.

In this case, the cell array portion is illuminated in the illuminating condition of the exposure device and a portion other than the cell array is illuminated by diffraction light passing through the diffraction grating which is formed on the opposite surface of the exposure mask. For example, an effect which is approximately equal to the effect obtained by using the above-described aperture having four main portions whose radius is limited to $\sigma s$ and which lie at a distance of $\sigma r$ from the optical axis can be attained by previously forming the diffraction grating patterns intersecting at an angle of 45 degrees and having a phase difference of approximately 180 degrees with respect to the exposure light.

Further, in the third aspect of this invention, the repeat pattern portion and the non-repeat pattern portion are simultaneously exposed in the same illuminating condition. For example, if the exposure process is effected based on the step-and-repeat system using the above exposure mask, the repeat pattern portion is aligned with a preset chip in one exposure step and the non-repeat pattern portion is aligned with an adjacent chip and the pattern portions are exposed. Thus, the patterns separately formed on a plurality of regions on the exposure mask are each transferred onto the chip on the substrate.

With this method, the region in which the repeat pattern and the non-repeat pattern of the exposure mask are formed must be formed according to the size of the step. That is, it is necessary to form the region according to the multiple of the pitch of the chip arrangement previously formed on the substrate. With this structure, a special alignment exposure step for aligning both of the pattern portions becomes unnecessary.

As described above, in the general semiconductor device manufacturing process, an alignment mark for alignment is formed on the substrate on which constituents of the device are previously formed and the superposed exposure process is effected after the alignment mark is detected and the alignment process is effected. That is, according to the third aspect of this invention, the same exposure sequence as the normal exposure sequence can be used and the precision of alignment can be further enhanced in comparison with the first and second aspects of this invention. In the first and second aspects of this invention the exposure process must be effected several times for one semiconductor device pattern in the exposure sequence, but in the third aspect of this invention, the exposure process of one time is sufficient.

The exposure method using an optical element having a diffraction grating formed on the illumination side of the exposure mask is disclosed in Jpn. Pat. Appln. KOKAI Publication No. 4-343215. In this method, the illuminating condition is not changed by the exposure device and the same effect as that obtained when the illuminating condition is changed is attained by properly designing the exposure mask. That is, in this method, the diffraction light passing through the diffraction grating is not applied only to a specified portion of the device pattern formed on the opposite surface. Since the diffraction light is emitted from the diffraction grating in an oblique direction, it is impossible to set the illumination area of the diffraction light with the precision of submicron or less. Therefore, the patterns of the cell array and a portion other than the cell array are illuminated in substantially the same illuminating condition. As a result, as described in the problem (1) of the related art, it is impossible to enhance the performance of resolution for both of the repeat pattern portion and the non-repeat pattern portion.

Since the objective of this invention is to attain the sufficiently high performance of resolution for each pattern by changing the illuminating condition for each pattern, this invention is basically different from the above proposal.

According to the fifth aspect of this invention, a pattern lying at the end of the regular arrangement of the repeat pattern portion is formed as a dummy pattern and the pattern is so formed as not to function as a semiconductor element. Specifically, a first dummy pattern which is the same in configuration as the real pattern but does not function as an element is formed at the end of the regular arrangement of the repeat pattern portion and a second dummy pattern which is larger than the first dummy pattern is formed outside the repeat pattern portion.

If the first dummy pattern which is the same in configuration as the real pattern but does not function as an element is formed at the end of the regular arrangement of the repeat pattern portion, the light intensity of a projected image of the memory cell in this portion can be recovered. However, since the light intensity of a projected image of the first dummy pattern portion is low, a residue may be left behind in some cases depending on the pattern size when a negative resist is used. In order to prevent occurrence of the residue, the second dummy pattern which is larger than the repeat pattern is formed in position outside the first dummy pattern. With this arrangement, a lowering in the light intensity in the first dummy pattern can be suppressed. The second dummy pattern is formed with such a large size that the light intensity thereof will not be lowered even at the end of the regular arrangement.

In this case, the light intensity of the projected image of the first dummy pattern becomes higher than that of the repeat pattern by forming the second dummy pattern. However, the light intensity of the projected image in the repeat pattern portion is made constant.

The light intensities of the first and second dummy patterns are set to such a large value that a negative resist pattern can be formed. Therefore, if the ground material is etched with the resist used as a mask in a next step of the resist pattern forming process of the semiconductor manufacturing device, a pattern is formed also as the ground material.

In order to prevent the dummy pattern from functioning as a memory cell, the following two methods can be used.

1. In the process of forming a semiconductor memory device, an exposure mask pattern is formed to omit a dummy memory cell portion at the end of the regular arrangement in at least one of the steps other than this lithography step. For example, it is formed such that the upper-level wiring layer will not be formed in contact with the dummy cell.

2. The pattern corresponding to the end of the regular arrangement is formed in the same form as the repeat pattern, but it is formed so as not to be connected in the connecting portion between the repeat pattern portion and the non-repeat pattern of the peripheral circuit.

Next, the sixth aspect of this invention is explained.

This invention has been made by taking it into consideration that a negative resist is inferior to a positive resist in the performance of resolution. A step of the process for manufacturing a semiconductor memory device other than the lithography step, that is, a film forming step or etching step is properly designed so as to permit a pattern to be formed by use of an alternating phase shifting mask and a positive resist.

A process for manufacturing a conventional semiconductor memory device is explained. First, after a desired film is formed on the substrate used as a ground, a negative resist is coated. Then, the exposure process is effected by use of the alternating phase shifting mask to form a resist pattern on the film. Next, the desired film is etched with the resist used as a mask to form a pattern.

On the other hand, in a process for manufacturing a semiconductor memory device according to this invention, an insulating film is previously formed on the substrate and a positive resist is coated on the insulating film. Then, an exposure mask pattern is transferred onto the positive resist. Next, the insulating film is etched with the resist pattern used as an etching mask. Then, the resist is removed and a desired film is formed on the entire surface. At this time, the desired film is filled in trenches formed in the insulating film. Then, part of the film which lies in a portion other than the trench portion is removed while the surface of the structure is being planarized by the CMP (Chemical Mechanical Polishing) process, for example. As a result, a pattern of the desired film is formed in the trenches of the insulating film.

With the above method, the pattern can be formed by use of the positive resist as described above and the precision of the pattern transfer by use of the alternating phase shifting mask can be further enhanced.

However, the method for forming the trenches in the insulating film, filing the desired film in the trenches and then removing part of the film which lies in a portion other than the trench portion cannot be applied to all of the processes using the alternating phase shifting mask. For example, when the desired film is filled, there occurs a problem that it is brought into contact with the ground thereof. That is, if the contact resistance exceeds a threshold value which may cause a problem in the operation of the semiconductor memory device, this process cannot be used.

Instead of effecting the CMP process, it is possible to effect the etchback process by RIE after the surface of the structure is planarized by etching the entire surface by RIE or coating a resist or SOG on the surface.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, a illustrate presently preferred embodiments of the invention, and together with the general description given above and the detailed description of the preferred embodiments given below, serve to explain the principles of the invention.

FIG. 1 is a view for illustrating the normal arrangement and abnormal arrangement in the phase shifting mask;

FIG. 2A is a view for illustrating a problem occurring when a positive resist is used;

FIG. 2B is a view for illustrating an example in which the same resist pattern as that of FIG. 2A is formed by use of a negative resist;

FIG. 9 is a plan view of a mask pattern used for comparison of the mask performances;

FIGS. 10A and 10B are light intensity profiles taken along the lines A–A' line and B–B' line of FIG. 9 when the mask pattern of FIG. 9 is formed of an alternating phase shifting mask;

FIGS. 11A and 11B are light intensity profiles taken along the lines A–A' line and B–B' line of FIG. 9 when the mask pattern of FIG. 9 is formed of an attenuated phase shifting mask;

FIG. 14 is a pattern view for illustrating a third embodiment and showing an example in which dummy patterns are disposed on the end portion of the element region (½ pitch arrangement of an element region pattern) of the memory cell array;

FIG. 21A is a view showing the chip arrangement on the wafer and an exposure mask for illustrating a fifth embodiment;

FIG. 21B is a schematic cross sectional view of a mask according to the fifth embodiment;

FIGS. 23A to 23E are cross sectional views of a mask showing a process in the order of the steps for forming an exposure mask according to a modification of the sixth embodiment.

DETAILED DESCRIPTION OF THE INVENTION

There will now be described embodiments of this invention with reference to the accompanying drawings.

(First Embodiment)

An example in which the second aspect of this invention is applied to a method for forming the bit line pattern of a 1-Gbit DRAM is explained.

Figure 3:
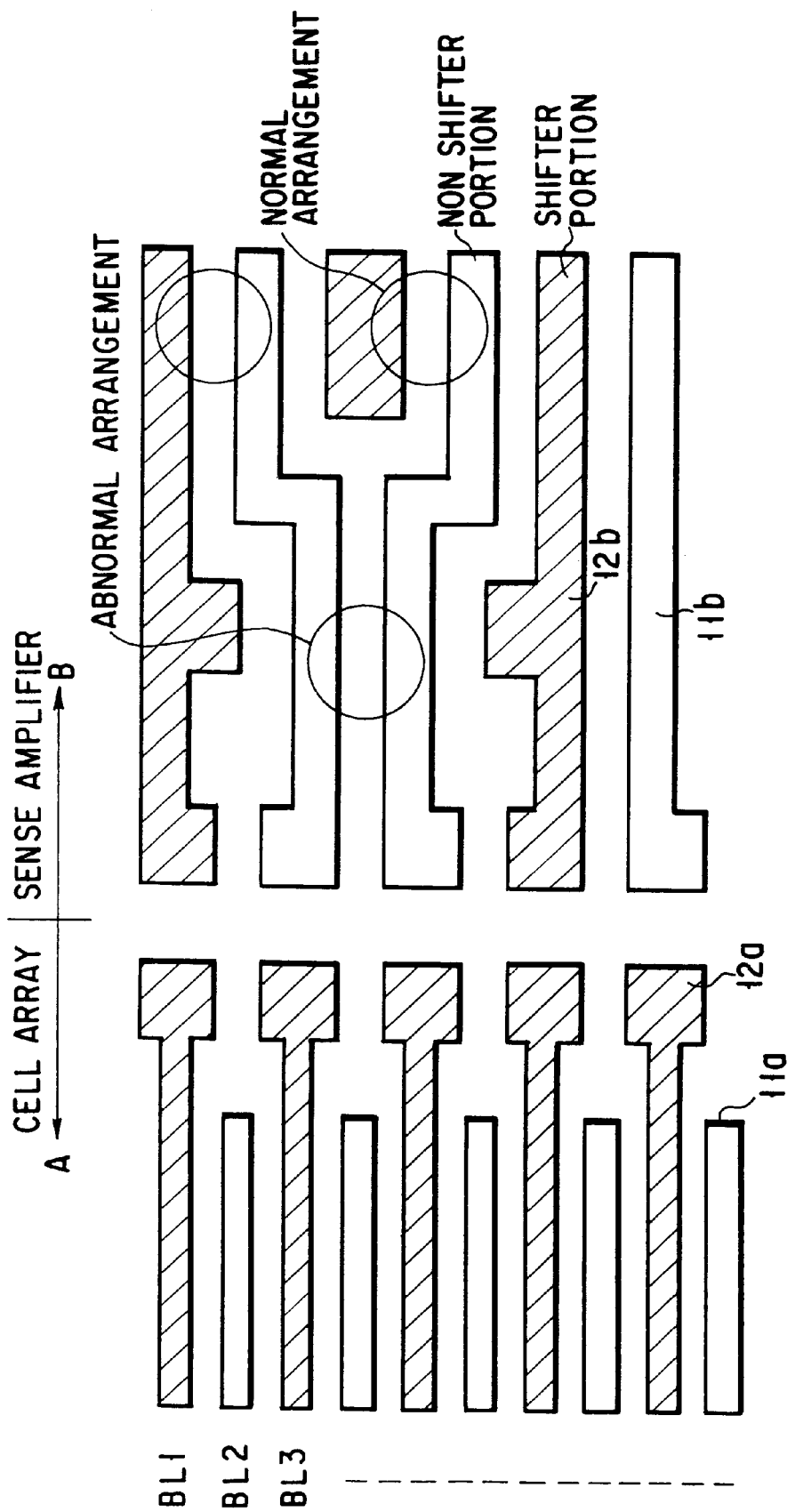
FIG. 3 is a plan view showing a phase shifting mask used in the embodiments of this invention including the first embodiment and showing an example in which phase shifters are arranged in the patterns of the bit lines of the sense amplifier and the memory cell array.

FIG. 3 shows the layout of a bit line pattern. In FIG. 3, the left portion indicates a pattern of a memory cell array region (which is hereinafter referred to as a cell array region) A and a pattern of a sense amplifier region B. Voided (non-hatched) portions 11 (11a, 11b) indicate opening patterns (non-shifter portions) and hatched portions 12 (12a, 12b) indicate phase shifter patterns (shifter portions). In this embodiment, the patterns of the cell array region A and sense amplifier region B are separately formed for two different exposure masks.

The pattern of the cell array region A is formed based on the design rule of 0.15 $\mu$m and the mask is formed as an alternating phase shifting mask. The pattern of the sense amplifier region B is formed based on the design rule of 0.225 $\mu$m and the mask is formed as an attenuated phase shifting mask. In this case, the design rule corresponds to the minimum line width.

Prior to the explanation of the embodiment, examples of the constructions of the alternating phase shifting mask and half-tone phase shifting mask (attenuated shifting mask) are explained with reference to FIGS. 4A to 4C and FIGS. 5A and 5B.

Figure 4A:
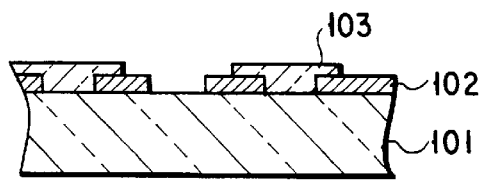
FIGS. 4A to 4C are cross sectional views of masks showing examples for the structure of an alternating phase shifting mask.
Figure 4B:
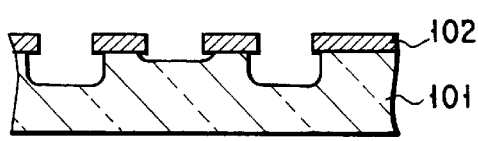
Figure 4C:
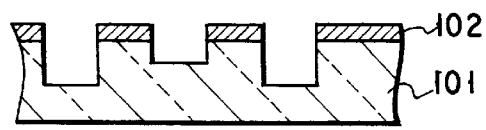

FIGS. 4A to 4C show an example of the alternating phase shifting mask, and an opening pattern of an opaque film 102 is formed on a transparent substrate 101 of quartz or the like and a phase shifting film 103 is formed on one of every adjacent two openings of the opening pattern as shown in FIG. 4A. Then, engraving amounts of the transparent substrate 101 are alternately set to different values in the respective openings to provide a phase difference as shown in FIGS. 4B and 4C.

Figure 5A:
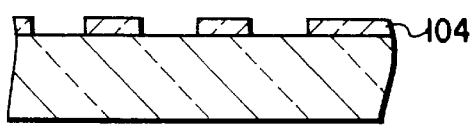
FIGS. 5A and 5B are cross sectional views of masks showing examples for the structure of an attenuated phase shifting mask.
Figure 5B:
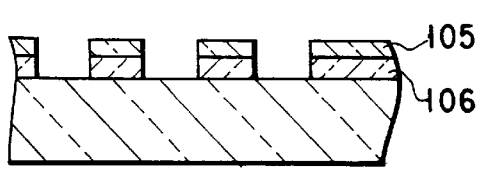

FIGS. 5A and 5B show an example of the attenuated shifting mask, and a single-layer attenuated film 104 is formed on the transparent substrate 101 as shown in FIG. 5A. Then, a first attenuated film 106 for transmission adjustment and a second attenuated film 105 for phase difference adjustment are formed on the transparent substrate 101 as shown in FIG. 5B.

First, a method for forming the alternating phase difference mask is explained with reference to FIGS. 6A to 6D.

Figure 6A:
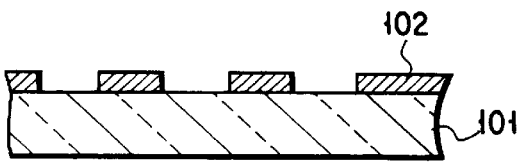
FIGS. 6A to 6D are cross sectional views of masks for illustrating a process in the order of the steps for forming an alternating phase shifting mask.
Figure 6B:
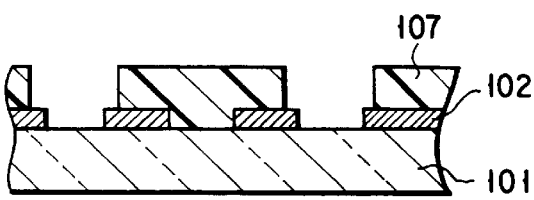

First, as shown in FIG. 6A, after an opaque film 102 of Cr is formed on a quartz substrate 101, openings are formed in the opaque film 102 by a known lithography process to form an opaque film pattern. Then, as shown in FIG. 6B, after a resist 107 is formed on the entire surface, an opening pattern corresponding to the openings is drawn by use of a laser writing system and developed to form openings in the resist.

Figure 6C:
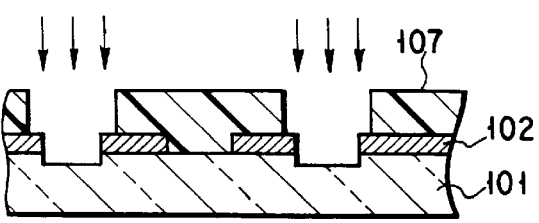
Figure 6D:
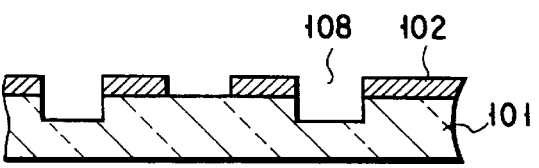

Next, as shown in FIG. 6C, the exposed surface of the quartz substrate 101 is etched by using the resist 107 and opaque film 102 as a mask. Finally, as shown in FIG. 6D, the resist 107 is removed to complete an alternating phase shifting mask having shifter portions 108 formed in alternate openings.

The process for etching the quartz substrate ($SiO_2$) is effected by use of a parallel plate reactive ion etching system under a condition of gas $CF_4+O_2$, pressure of 60 mTorr, and RF power of 0.75 W/cm$^2$. Assuming that an exposure device having a KrF laser of wavelength 248 nm as a light source is used, the etching process is effected to attain the etching depth of 244 nm which causes a phase difference of 180 degrees when the wavelength 248 nm is used. After the etching process, the actual phase difference was measured and it was confirmed that the phase difference was set at 180.6 degrees.

Next, a method for forming the attenuated shifting mask is explained.

First, the quartz substrate having a Cr film formed thereon is subjected to the mask blanking process to form a pattern in which Cr in the half-tone pattern forming area is removed. Then, an $SiN_XO_Y$ film is formed as an attenuated phase shifting mask on the entire surface of the exposure mask by the sputtering method. After this, Si is used as a target of sputtering, a gas of $Ar+O_2+N_2$ is prepared and a film having the transmission 8% for the light of wavelength 248 nm is formed by adjusting the gas flow rate and application voltage. The result of actual measurement made after the film was formed indicated that the film thickness was 104 nm and the phase difference was 178.9 degrees.

Next, a resist is coated on the entire surface and a resist mask pattern is formed by use of a laser drawing tool. Then, the $SiN_XO_Y$ film exposed to the resist opening portion is etched by the RIE (reactive ion etching) method and the resist is removed to complete the attenuated shifting mask.

Now, the exposure process in this embodiment is explained in detail.

First, a first exposure process is effected for a first negative resist on a semiconductor wafer by use of an alternating phase shifting mask having a pattern of the cell array region A of FIG. 3 formed thereon. In this case, although not specifically shown in the drawing, a structure obtained by effecting the process up to the step of forming a bit line pattern is already formed on the wafer. As the exposure device, an exposure device having a KrF laser of wavelength 248 nm as a light source is used.

More specifically, the first exposure process is effected while sequentially aligning the mask pattern of the alternating phase shifting mask which is the cell array region A of FIG. 3 according to the arrangement of chips previously formed on the wafer. The above exposure process is effected while sequentially replacing the substrates with 24 substrates dealt as one unit (one lot). The illumination process is effected under a condition of NA=0.6, σ=0.3 and the exposure dose of 42 mJ/cm$^2$.

After the resist pattern of the cell array region A is transferred to 24 substrates of one lot, the mask of the exposure device is replaced by an attenuated phase shifting mask on which the pattern of the sense amplifier region B of FIG. 3 is formed and the second exposure process is effected. In this case, the illuminating condition of the device is changed such that the NA (numerical aperture) is set to 0.6 and σ is defined in a condition in which an aperture having four openings with a radius σs or less at a distance of σr from the optical axis in a direction at an angle of 45 degrees with respect to the line-and-space pattern on the exposure mask with the light source set as a center is used. The aperture will be described with reference to FIG. 8C. In this embodiment, an aperture of σr=0.75 and σs=0.15 is used and the exposure process is effected with the exposure dose of 64 mJ/cm$^2$.

Likewise, after the pattern of the sense amplifier region B is sequentially transferred to the resists on the substrates of one lot, the resist baking process is effected after exposure thereof and the resist is developed to form a resist pattern. After this, the bit line material is etched by use of the resist pattern to proceed the process for manufacturing the 1-Gbit DRAM.

Figure 7:
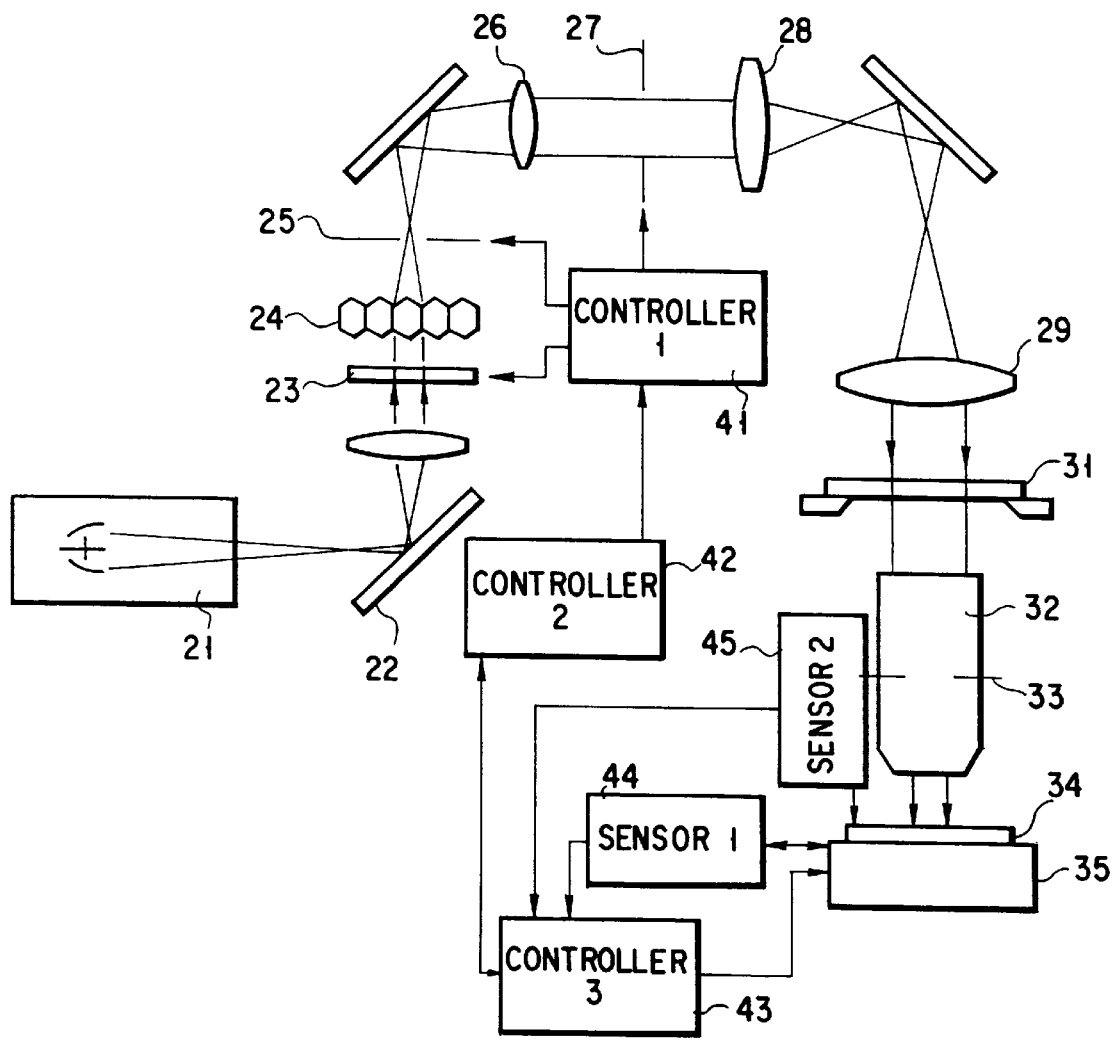
FIG. 7 is a schematic view showing the construction of an exposure device used in the first embodiment.

The construction of the exposure device used in this embodiment is shown in FIG. 7. A reference numeral 21 denotes a light source constructed by an Hg-Xc lamp or KrF, ArF laser, 22 a cold mirror, 23 a narrow-band filter, 24 a fly eye lens, and 25 a selectable aperture inserted in position which is generally called a secondary light source plane. Further, a reference numeral 26 denotes an input lens, 27 a reticle blind for limiting the exposure area of the exposure mask, 28 an output lens, 29 a condenser lens, 31 an exposure mask, 32 a projection optical system for projecting a pattern on the exposure mask 31 on the substrate by a lens, mirror or a combination thereof, 33 an aperture for determining the numerical aperture (NA) inserted in the pupil position of the projection optical system, 34 a wafer substrate, and 35 a wafer stage. Further, a reference numeral 41 denotes an aperture/filter control unit (controller 1), 42 a main control unit (controller 2), 43 a wafer stage control unit (controller 3), 44 a wafer XY position detecting mechanism (sensor 1), and 45 a wafer Z position detecting mechanism (sensor 2).

When a pattern on the exposure mask is projected on the substrate by use of the device with the above structure, the resolution and the depth of focus which are the characteristics of the projected image vary depending on the numerical aperture NA of the projection optical system and the shape of the secondary light source. The σ aperture is incorporated into the selectable aperture 25. The σ aperture used for the first exposure and the σ aperture for off-axis illumination used for the second exposure are previously set in the selectable aperture 25.

The selectable aperture 25 can be controlled by a console of an exposure device via the control mechanism 41. Therefore, when the first and second exposure conditions are set by the console, a σ aperture can be automatically replaced by selecting a desired σ aperture from the selectable aperture 25 in which desired σ apertures are set. Thus, it is not necessary to take a long time for replacing the σ apertures in the first and second exposure processes.

Figure 8A:
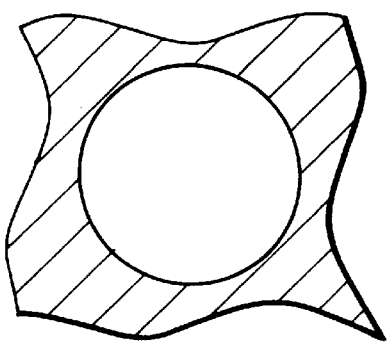
FIGS. 8A to 8C are plan views of apertures showing examples of various types of apertures.
Figure 8B:
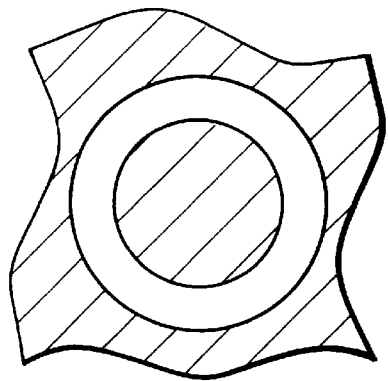
Figure 8C:
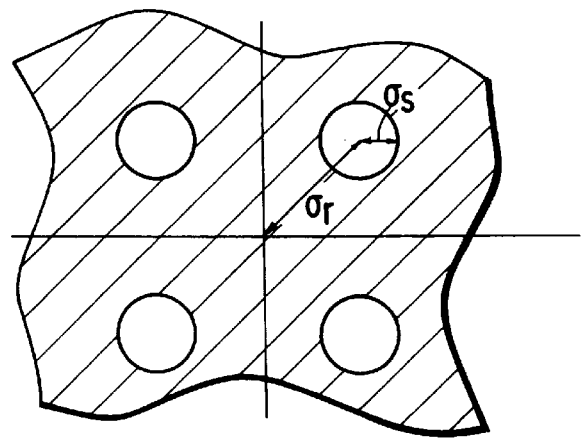
Figure 8D:
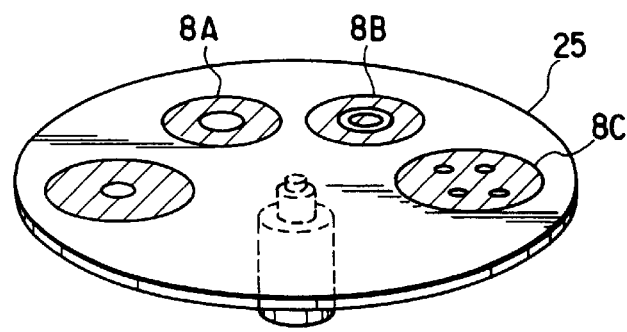
FIG. 8D is a perspective view showing a selectable aperture having the apertures of FIGS. 8A to 8C incorporated therein.

FIGS. 8A to 8D show examples of the selectable aperture 25 and apertures incorporated in the selectable aperture. FIG. 8A shows a circular opening aperture, FIG. 8B shows an annular opening aperture, and FIG. 8C shows an aperture having four opening portions with a radius σs or less at a distance of σr from the optical axis in a direction at an angle of 45 degrees with respect to the line-and-space pattern on the exposure mask with the optical axis set as a center. The above apertures are incorporated in the disk-form selectable aperture 25 as shown in FIG. 8D and one of the apertures can be selected by rotating the disk plate.

Further, an alignment mark for aligning the already formed structure with the transfer pattern is formed on the wafer 34. Both of the exposure mask (alternating phase shifting mask) of the cell array region A and the exposure mask (attenuated shifting mask) of the sense amplifier region B in FIG. 3 are subjected to the exposure process after the position of the alignment mark is detected and the position of the exposure mask and wafer is adjusted.

Next, an example in which the profile of light intensity obtained when all of the patterns shown in FIG. 9 are formed by use of the alternating phase shifting mask is compared with the profile of light intensity obtained when all of the patterns are formed by use of the attenuated shifting mask is explained.

FIGS. 10A and 10B show the light intensity profiles of the bit line patterns obtained when the cell array region A and sense amplifier region B are both exposed by use of the alternating phase shifting mask. Likewise, FIGS. 11A and 11B show the light intensity profiles of the bit line patterns obtained when the above regions are both exposed by use of the attenuated shifting mask. In FIGS. 10A, 10B, 11A and 11B, solid lines indicate the light intensity in the case of just focus, broken lines indicate the light intensity in the case of defocus of 0.2 μm, and one-dot dash lines indicate the light intensity in the case of defocus of 0.4 μm.

When the exposure process is effected by using the alternating phase shifting mask in a condition of NA=0.6 and σ=0.3, the cell array region A can be resolved in a good condition as shown in FIG. 10A by forming phase shifters in alternate patterns. However, in the sense amplifier region B, the abnormal arrangement occurs in a C portion if phase shifters are formed in the alternate patterns thereof, and the pattern in the abnormal arrangement, as shown in FIG. 10B, particularly, in the case of defocus, encounters a difficulty in resolution, due to a light intensity increase at a portion originally to be darkened.

On the other hand, when the exposure process is effected by using the attenuated shifting mask in a condition of NA=0.6, σr=0.75 and σs=0.15, the sense amplifier region B can be resolved in a relatively good condition as shown in FIG. 11B, but in the cell array region A, the contrast between the peak and the valley of the light intensity is lowered as shown in FIG. 11A and the region cannot be resolved. That is, the optimum illuminating conditions in the cell array region A and the sense amplifier region B are different.

As described before, in this embodiment, the cell array region A is exposed by using the alternating phase shifting mask in the illuminating condition of NA=0.6 and σ=0.3 and the sense amplifier region B is exposed by using the attenuated shifting mask in the illuminating condition of NA=0.6, σr=0.75 and σs=0.15. Therefore, the light intensity profile on the wafer in this embodiment is set to the same light intensity profile as shown in FIG. 10A in the cell array region A and set to the same light intensity profile as shown in FIG. 11B in the sense amplifier region B, and thus both of the regions can be exposed in the optimum conditions.

It is generally desirable to set the condition of $0.6 \leq \sigma r \leq 0.9$ and $0.15 \leq \sigma s \leq 0.3$ as the illuminating condition (aperture condition) for the sense amplifier region B.

Thus, by using the above-exposing process, the depth of focus of 1.12 μm was obtained when the exposure latitude 10% was expected while the line width tolerance for a desired line width was suppressed to 10% or less in the cell array region A. Also, in the sense amplifier region B, the depth of focus 1.22 μm was obtained with the same reference. This was a sufficiently high resolution performance in the process for manufacturing the semiconductor memory device.

In this embodiment, the pattern of the cell array region A is first exposed onto all of the chips for a plurality of wafers and then the pattern of the sense amplifier region B is exposed onto all of the chips, but the exposing order may be reversed. Further, it is possible to expose the pattern of the cell array region A and the pattern of the sense amplifier region B for one chip and repeatedly effect the process for each chip.

Figure 12:
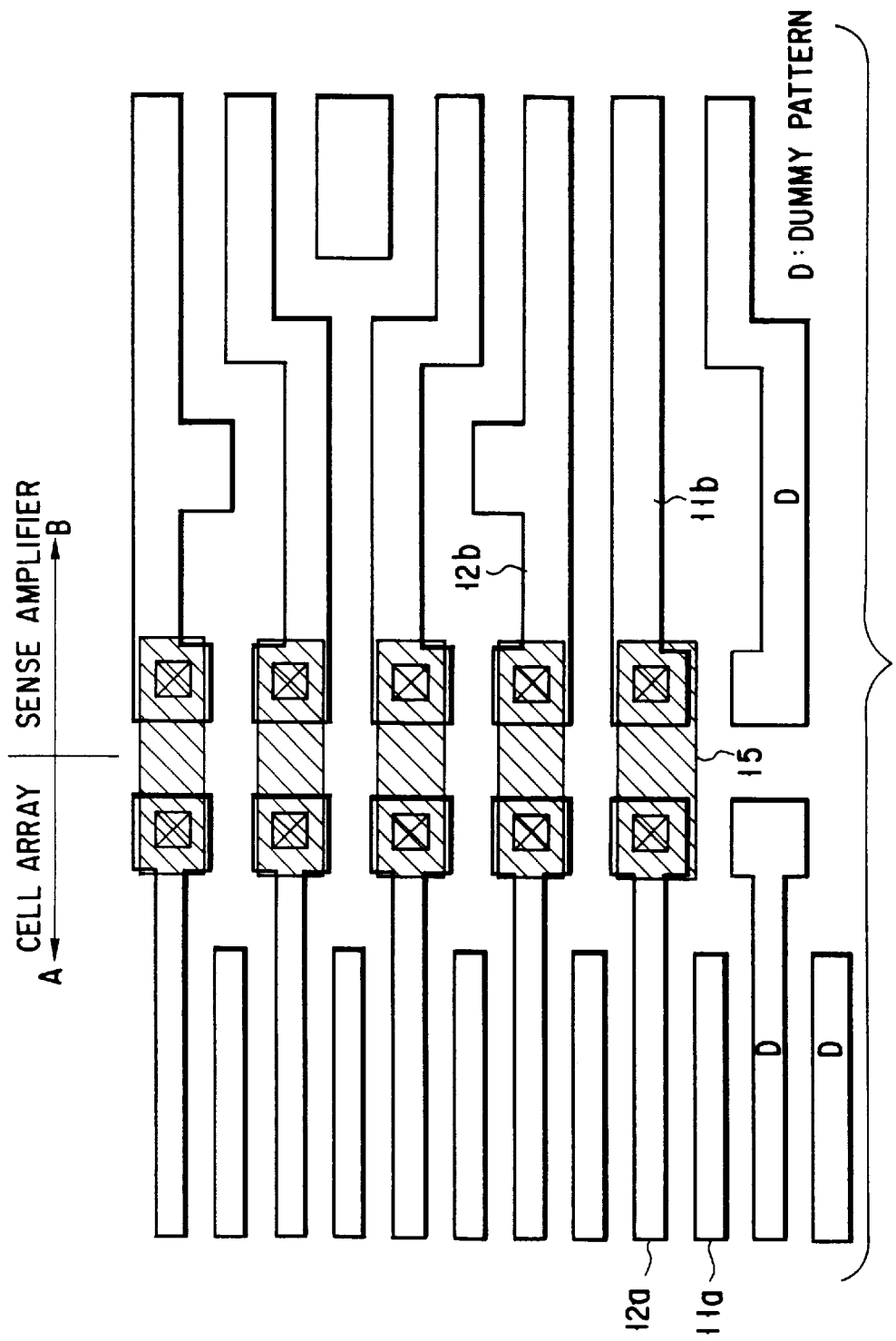
FIG. 12 is a plan view of a semiconductor element for illustrating the junction between the sense amplifier region and the memory cell region of the bit line pattern.

Further, when the cell array region A and the sense amplifier region B are exposed by use of different masks as in the case of this embodiment, it becomes necessary to connect bit lines on the cell array side to bit lines on the sense amplifier side. In this case, as shown in FIG. 12, a connection pattern 15 for connecting the bit lines to each other may be formed on a different wiring layer. When the dummy pattern is formed, a connection pattern for connecting the dummy patterns is not formed.

(Second Embodiment)

A concrete method for applying the pattern forming method of the first embodiment to the bit line pattern forming process of an actual semiconductor device (4-Gbit DRAM) is explained.

The same pattern layout as that shown in FIG. 3 is used. However, in this case, the design rule of the cell array is 0.12 μm and the design rule of the sense amplifier is 0.18 μm.

The pattern of the cell array region A shown on the left side in FIG. 3 is formed as an alternating phase shifting mask. Assuming that an exposure device having an ArF (argon fluoride) laser of wavelength 193 nm as a light source is used, the etching process is effected to attain the etching depth of 190 nm which causes a phase difference of 180 degrees when the wavelength 193 nm is used. The pattern of the sense amplifier region B shown on the right side in FIG. 3 is formed as a normal Cr pattern in a different region on the same exposure mask on which the cell array pattern is formed.

Figure 13B:
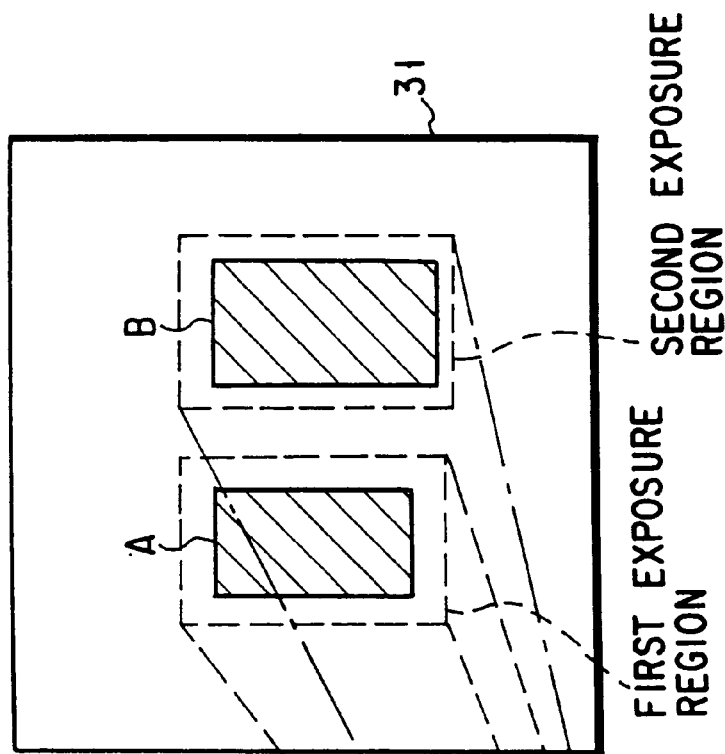
FIG. 13 is a view showing the chip arrangement on the wafer and an exposure mask for illustrating a second embodiment.
Figure 13A:
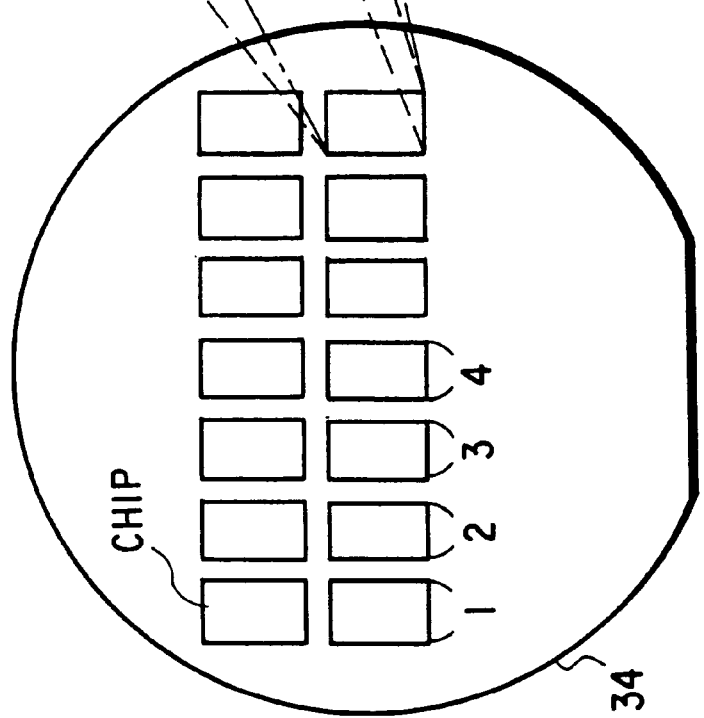

As shown in FIG. 13, the pattern of the cell array region A and the pattern of the sense amplifier region B are formed in parallel on the exposure mask 31. By forming the above patterns on the same exposure mask 31, the amount of mis-alignment between the patterns of the cell array and sense amplifier can be suppressed.

Next, the exposure process in this embodiment is explained.

First, a W film which is a material of bit lines is formed on the entire surface of the semiconductor wafer 34 on which a structure obtained by a process up to a step before the bit line pattern forming step is already formed and then a negative resist is coated to a film thickness of 0.5 $\mu$m on the resultant structure.

Next, the pattern of the cell array region A on the exposure mask 31 shown in FIG. 13 is sequentially aligned according to the arrangement of a plurality of chips previously formed on the wafer and the first exposure process is effected. The illuminating condition is set such that NA=0.7, $\sigma$=0.3 and the exposure dose is 74 mJ/cm$^2$. The exposure process is effected for all of the chips according to the chip arrangement.

Next, the second exposure process is effected for all of the chips according to the chip arrangement. The pattern of the sense amplifier region B on the exposure mask 31 shown in FIG. 13 is transferred onto the wafer. The second exposure process is effected in a condition that NA=0.6, an annular illumination aperture having an outside diameter of 0.6, shielding an area which lies within the inside diameter of 0.4 and having the light shielding rate $\epsilon=\frac{2}{3}$ as shown in FIG. 5B is used as the $\sigma$ aperture, and the exposure dose is 60 mJ/cm$^2$.

As the preferable condition of the annular illumination aperture, the outside radius $\sigma a$ of the annular area with respect to the optical axis and the ratio $\epsilon$ of the outside radius and inside radius may be set to satisfy the ranges of $0.6 \leq \sigma a \leq 0.9$ and $0.5 \leq \epsilon \leq 0.75$ when the radius of the pupil of the projecting optical system is set to 1.

The above process is effected while sequentially replacing the wafers with 24 wafers dealt as one lot. The exposure of resist is sequentially effected for the wafers in the order in which they have been subjected to the exposure process, and the baking and developing processes are effected to form resist patterns.

By use of the above exposure process, the depth of focus of 1.55 $\mu$m was obtained when the exposure latitude 10% was expected while the line width tolerance for a desired line width was suppressed to 10% or less in the cell array region. Also, in the sense amplifier region, the depth of focus 1.43 $\mu$m was obtained with the same specification.

The exposure condition used in this embodiment is one example, and the optimum exposure condition may be selected according to the design rule and the layout of each of the cell array portion and the sense amplifier portion which is formed adjacent to the cell array.

Further, in this embodiment, the first and second exposure processes are effected by use of a device having the same exposure light wavelength, but the first and second exposure processes may be effected by use of a device having different exposure light wavelengths. Further, as the exposure sequence, the first exposure process is effected for one wafer according to the chip arrangement, the second exposure process is effected after changing the exposure area and illuminating condition for the wafer, and the above operation is repeatedly effected for wafers of one lot. This is one example, and a different exposure sequence can be used. For example, the first process is first effected for wafers of one lot, and then the second exposure process may be effected after changing the exposure area and illuminating condition for the wafers. One of the above exposure sequences may be selectively used according to the alignment precision of the exposure device, the manufacturing efficiency of the semiconductor device and the like.

(Third Embodiment)

Next, a method for solving the problem occurring in the end portion of the repetitive pattern is explained by taking formation of an element region pattern of a 1-Gbit DRAM as an example.

FIG. 14 is a plan view showing a pattern of a cell array region in which element regions are repeatedly formed at a ½ pitch. In this example, the pattern size in the short-side direction (word line direction) of the element region is 0.15 $\mu$m, the pitch is 0.30 $\mu$m, the pattern size in the long-side direction (bit line direction) is 0.60 $\mu$m and the distance (element isolation distance) between the element regions in the long-side direction is 0.15 $\mu$m. Voided (non-hatched) portions indicate non-shifter portions and hatched portions indicate phase shifter portions.

In this embodiment, in the end portions of the repetitive pattern arrangement of the cell array in the short-side and long-side directions, first dummy patterns D1 for one more repetition are provided. This arrangement is the same as the pattern of the element region functioning as a memory cell. Further, a second dummy pattern D2 (width 0.25 $\mu$m) parallel to the long-side direction of the element region is formed outside the cell array. In this case, since the first dummy patterns D1 formed in the end portion of the repetitive pattern arrangement of the cell array in the long-side direction are arranged in a checkered configuration, the outwardly extending portions of the first dummy patterns D1 can be connected to a second dummy pattern D2 which is arranged in parallel to the short-side direction.

By using the above mask, the exposure process is effected in an exposure condition that NA=0.5, $\sigma$=0.5 and the exposure dose is set to 114 mJ/cm$^2$.

Figure 15A:
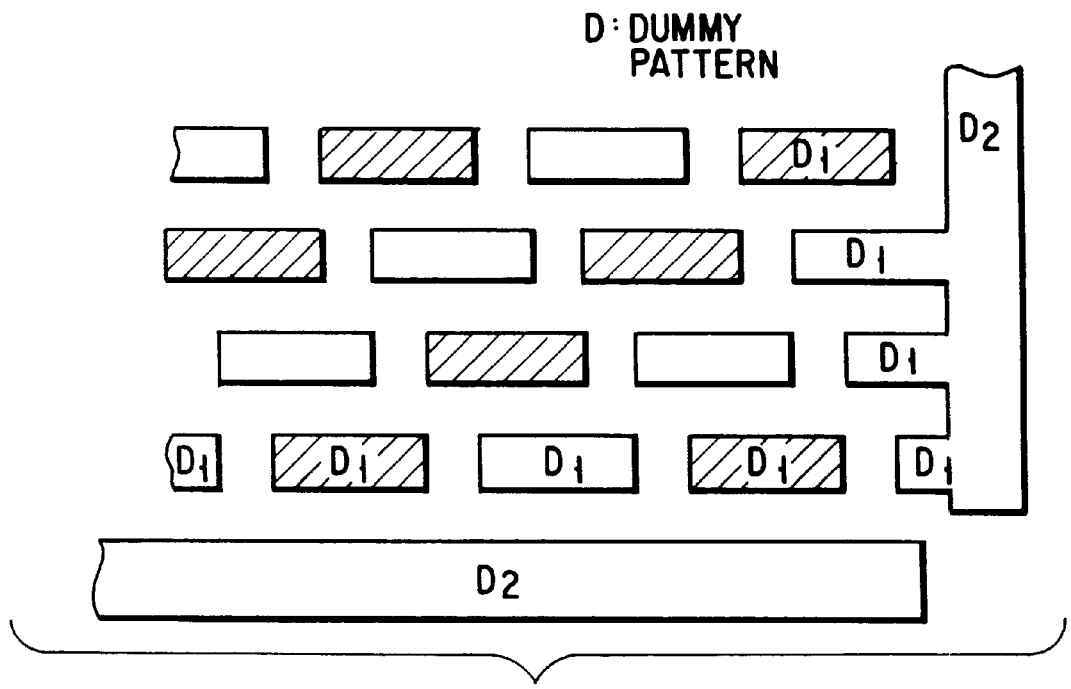
FIG. 15A is a pattern view for illustrating another example of the third embodiment and showing an example in which dummy patterns are disposed on the end portion of the element region (¼ pitch arrangement of an element region pattern) of the memory cell array.

FIG. 15A is a plan view showing the pattern of a cell array region in which element regions are repeatedly formed at a ¼ pitch. Also, in this case, in the end portions of the repetitive pattern arrangement of the cell array in the short-side and long-side directions, first dummy patterns D1 for one more repetition are provided. Further, second dummy space patterns D2 parallel to the long-side and short-side directions of the element region are formed outside the cell array.

Figure 15B:
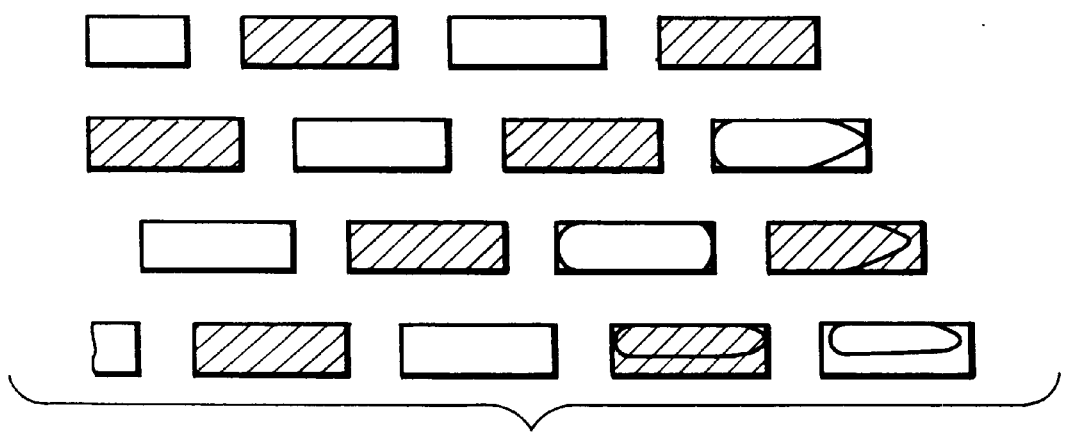
FIG. 15B is a view for illustrating a problem such as a reduction in the width of the tip end portion of the resist which may occur when dummy patterns are not disposed in the case of FIG. 15A.

If the dummy patterns D1, D2 are not formed, the light intensity in the end portion of the repetitive pattern arrangement is lowered as shown in FIG. 15B, the resist pattern cannot be formed into a desired shape, the tip end portion of the resist is thinned and the shape thereof is deformed so as to leave a resist residue. On the other hand, if the exposure mask of this embodiment is used, a lowering in the light intensity in the element region functioning as a memory cell can be suppressed as shown in FIG. 15A and the pattern can be formed with high precision. Further, by forming the patterns which are relatively larger than the element region outside the element region, occurrence of the resist residue can be prevented.

Figure 16A:
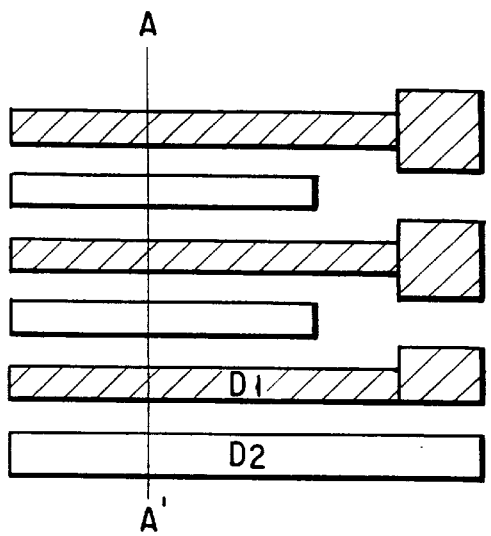
FIGS. 16A and 16B are pattern views for illustrating the effect of the third embodiment, FIG. 16A showing a case wherein the dummy pattern is disposed and FIG. 16B showing a case wherein the dummy pattern is not disposed.
Figure 16B:
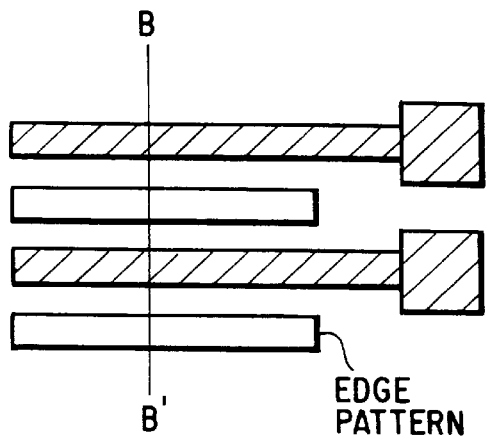
Figure 17A:
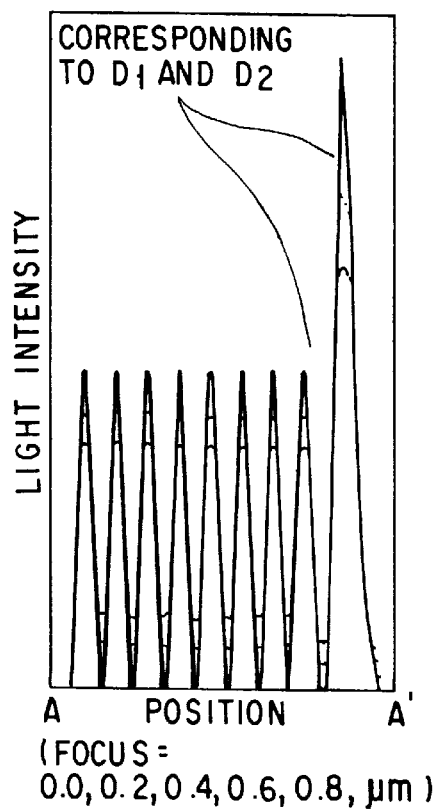
FIGS. 17A and 17B are light intensity profiles for illustrating the effect of the third embodiment, FIG. 17A showing a case wherein the dummy pattern is disposed and FIG. 17B showing a case wherein the dummy pattern is not disposed.
Figure 17B:
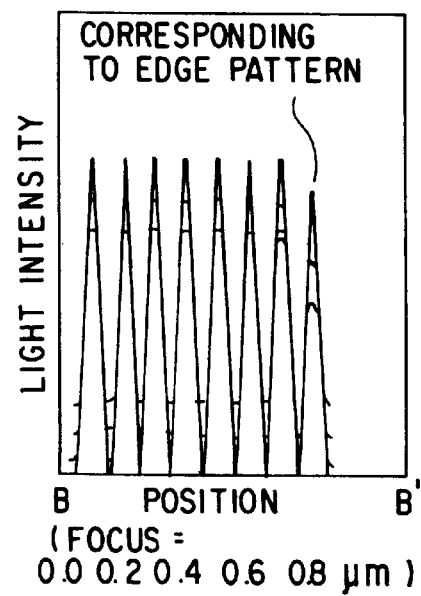
Figures 18A, 18B:
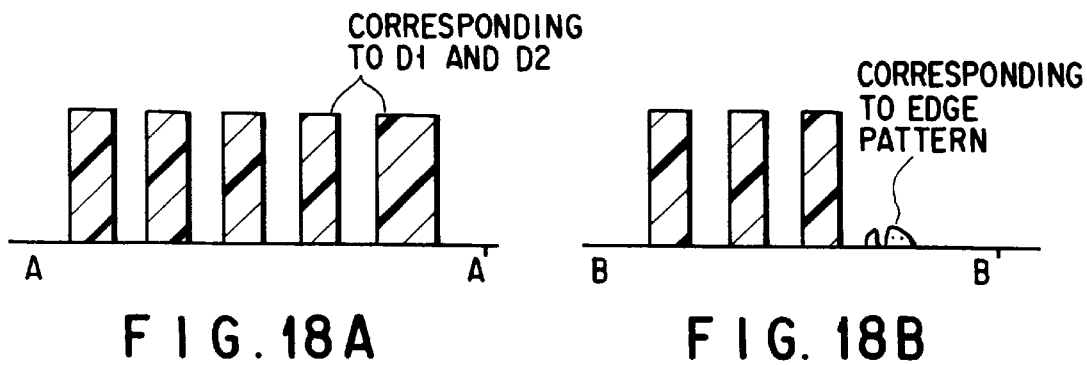
FIGS. 18A and 18B are cross sectional views of resist patterns for illustrating the effect of the third embodiment, FIG. 18A showing a case wherein the dummy pattern is disposed and FIG. 18B showing a case wherein the dummy pattern is not disposed.

The above operation is explained in detail with reference to FIGS. 16A to 18B. FIG. 16A is a pattern view showing the pattern arrangement when the first and second dummy patterns D1, D2 are formed and FIG. 16B is a pattern view showing the pattern arrangement when the dummy pattern D is not formed. FIGS. 17A and 17B show profiles of light intensities obtained by using the masks of FIGS. 16A and 16B. FIGS. 18A and 18B are cross sectional views of resist patterns obtained by using the masks of FIGS. 16A and 16B.

When the dummy pattern D is not formed, the light intensity becomes weak in the end portion of the repetitive pattern arrangement as shown in FIG. 17B and the residue of a resist pattern (which is part of the resist pattern which is left behind in the etching process) is left behind in the end portion of the repetitive pattern arrangement as shown in FIG. 18B.

On the other hand, when the first and second dummy patterns D1, D2 are formed, a lowering in the light intensity in the element region functioning as a memory cell can be suppressed as shown in FIG. 17A and the resist pattern of the element region can be formed with high precision as shown in FIG. 18A. Further, by forming the dummy pattern D2 which is relatively larger than the element region outside the element region, occurrence of the resist residue in the dummy pattern D1 can be prevented.

Figure 19:
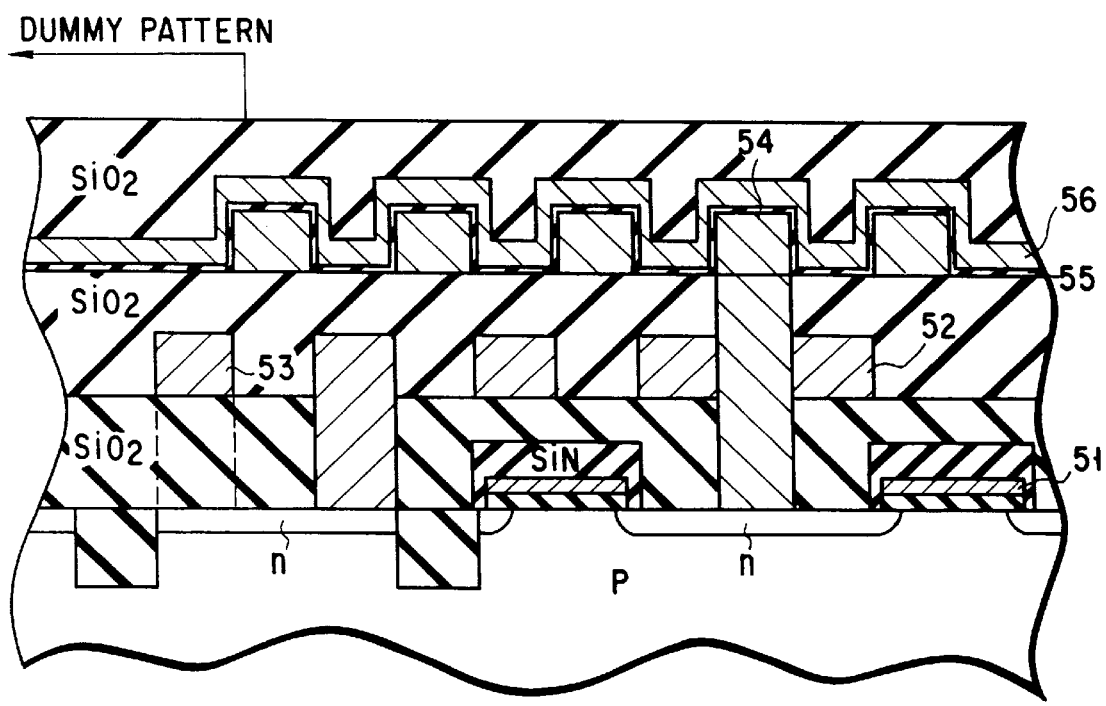
FIG. 19 is a cross sectional view of a semiconductor device when the dummy pattern is formed.

A region in which the dummy pattern is formed is not used to function as a memory cell. For example, as shown in FIG. 19, by forming a bit line 53 of the dummy pattern with a floating structure in which no contact is formed, the region in which the dummy pattern is formed can be prevented from functioning as a memory cell. A reference numeral 51 in FIG. 19 denotes a word line formed of WSi or poly-Si, 52 a bit line formed of W, 53 a dummy bit line, 54 a storage node, 55 a ferroelectric film, and 56 a plate electrode.

In this embodiment, the design rule of the pattern other than that of the cell array is 0.3 μm which is relatively larger than that of the cell array, and a sufficiently high exposure performance can be attained even if the exposure condition is adequately set for the cell array. Therefore, it is not necessary to prepare two types of exposure mask patterns for the cell array and the peripheral circuit.

(Fourth Embodiment)

Next, an embodiment in which the bit line pattern of a 1-Gbit DRAM is formed by use of a positive resist is explained.

The feature of this embodiment is that a positive resist can be used when a wiring pattern is formed by use of an alternating phase shifting mask, trenches corresponding to the wiring pattern are formed in the insulating film and the wiring material is filled in the trenches and a portion of the wiring material other than that filled in the trenches is removed.

Now, the substrate process and exposure process in this embodiment are explained.

First, an exposure mask used for forming a bit line pattern as shown in FIG. 3 is formed. The pattern in the cell array is formed as an alternating phase shifting mask. Although not explained here, a structure which is already obtained by a process up to a step before the bit line pattern forming step is already formed on the substrate.

Then, after an insulating film 61 is formed on the substrate 60, a positive resist 62 is coated to a film thickness of 0.5 μm on the insulating film 61 and then the exposure process is effected by use of the exposure mask to form a pattern of the positive resist 62. As the insulating film 61, a BPSG film is formed to a thickness of 0.6 μm by an atmospheric pressure CVD method. The exposure process is effected in a condition of NA=0.6 and σ=0.3.

Next, the pattern of the positive resist 62 is used as a mask to etch the insulating film 61. The etching process is effected by use of a magnetron RIE device in a condition that ($C_4F_8$+CO) gas is used, the pressure is set at 5 Pa, the frequency of an RF power source is set at 13.56 MHz, and the power is set to 4.2 W/cm². A plug 65 of poly-Si is previously formed as a bit line contact and the end of etching is detected by detecting the poly-Si by use of a plasma emission monitor.

Figure 20A:
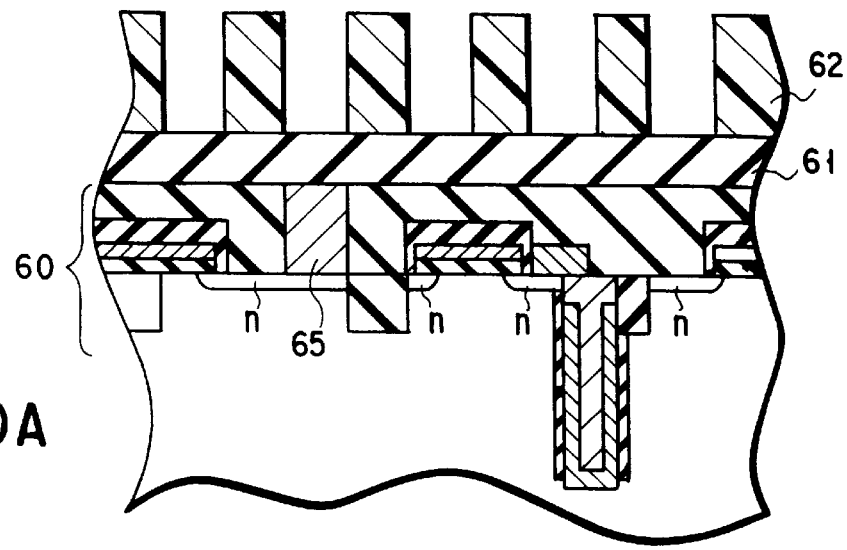
FIGS. 20A to 20C are cross sectional views showing a process in the order of the steps for manufacturing a semiconductor memory device, for illustrating a fourth embodiment.
Figure 20B:
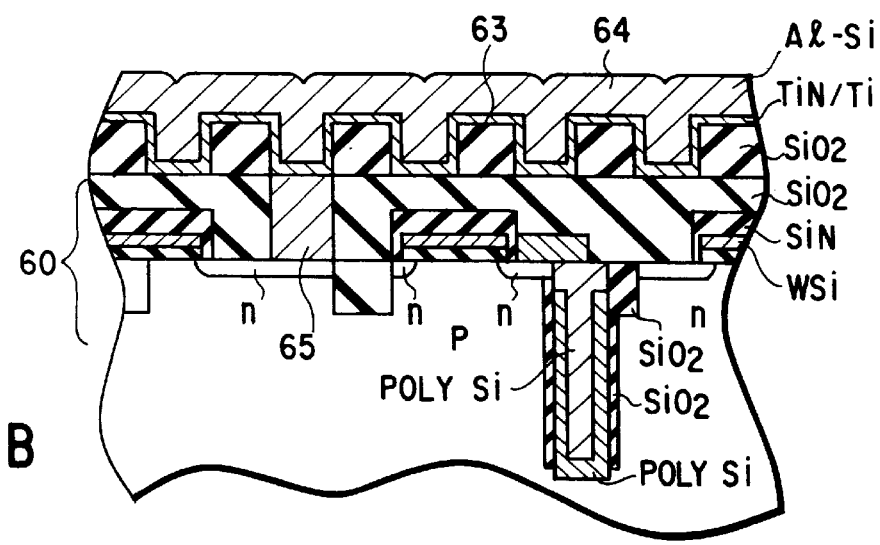

Next, as shown in FIG. 20B, the resist 62 is removed and a TiN film 63 is formed on the entire surface of the substrate by a low-pressure CVD system. Then, an Al-Si film (Al : 99 weight %, Si : 1 weight %) 64 is formed to a thickness of 1.0 μm by a plasma CVD method.

Figure 20C:
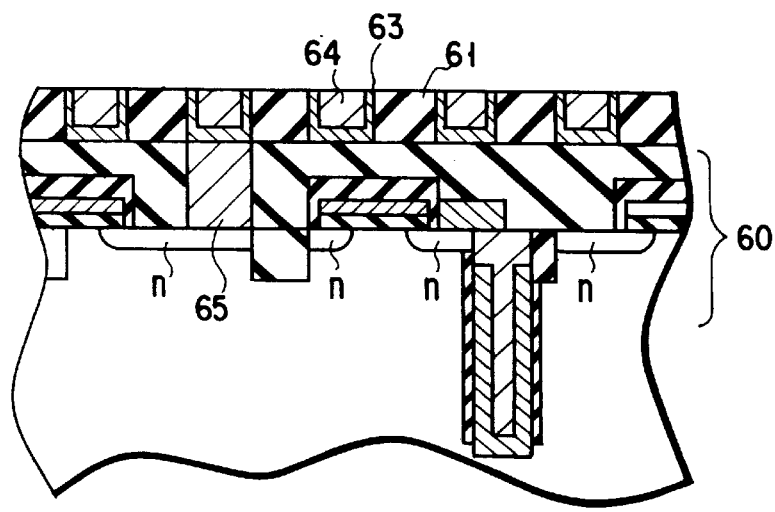

After this, as shown in FIG. 20C, the entire surface portion is etched by a CMP process to remove portions of the Al-Si film and TiN film other than the bit line forming portion. Thus, bit lines formed of the Al-Si film 64 can be formed in the trenches of the insulating film 61.

In a case where the exposure process using the alternating phase shifting mask was effected and if the negative resist was used as in the prior art case, the depth of focus of 0.93 μm was obtained when the exposure latitude 10% was expected while the line width tolerance for a desired line width was suppressed to 10% or less. On the other hand, if a positive resist was used as in this embodiment, the depth of focus of 1.34 μm was obtained and it was confirmed that the depth of focus could be significantly improved in comparison with a case wherein the negative resist was used.

(Fifth Embodiment)

Next, a method for forming a semiconductor device (memory cell of FIG. 3) using an exposure mask having a diffraction grating pattern is explained.

In the exposure mask in this embodiment, as shown in FIGS. 21A and 21B, the pattern of the cell array region A is formed of an alternating phase shifting mask and the pattern of a region (sense amplifier region) B other than the cell array is formed of a normal mask. The arrangement pitch on the mask 31 of each of the regions A, B is defined to correspond to the chip arrangement pitch on the wafer 34.

Next, a method for forming the exposure mask of this embodiment is explained.

In the cell array region A, an alternating phase shifting mask is formed by the process explained with reference to FIGS. 6A to 6D and a normal exposure mask is formed in the peripheral circuit region B. Then, after a resist is formed on the entire surface of the pattern of the exposure mask, a resist is formed on the opposite surface (rear surface). After this, a pattern is drawn in a region of the opposite surface corresponding to the peripheral circuit region B by use of an optical drawing tool and developed to form a diffraction pattern of the resist. Then, the resist pattern is used as a mask to etch the main body of the quartz substrate. Finally, the resists on both of the surfaces of the exposure mask are removed to complete the exposure mask.

As the diffraction grating pattern, a pattern of checkered form of 0.325 μm intersecting the wiring pattern of the cell array at an angle of 45 degrees is formed. The etching process for the quartz substrate is effected by use of a parallel plate RIE device in a condition that ($CF_4$+$H_2$) gas is used, the pressure is set at 40 mTorr, and the RF power is set at 0.8 W/cm². The etching process is effected to attain the depth of 244 nm which causes the phase difference of 180 degrees when the wavelength of 248 nm is set. After etching, the actual phase difference was measured and it was confirmed that the phase difference of 178 degrees was obtained.

Next, the exposure process is explained.

As the exposure device, an exposure device having a KrF laser of 248 nm as a light source is used and the exposure condition is set such that NA=0.6, σ=0.3, and the exposure dose is 80 mJ/cm².

As shown in FIG. 21A, the exposure process is effected by use of the above-exposure mask based on the step-and-repeat system. First, the exposure field is defined to contain the cell array region A and peripheral circuit region B and the first exposure process is effected for the wafer to transfer the mask pattern to the resists on two desired adjacent chips on the wafer. At this time, on the two chips, the cell array region A and peripheral circuit region B are respectively transferred. Then, the stage on which the wafer is mounted is moved by an amount corresponding to one chip and the second exposure process is effected. At this time, the position adjustment is made such that the peripheral circuit region B transferred on the resist by the first exposure process and the cell array region A formed by the second exposure process will be transferred in a predetermined positional relation on one of the two adjacent chips.

That is, two adjacent chips on the wafer are simultaneously exposed by one exposure process such that the pattern of the cell array will be exposed onto one of the chips and the pattern of the peripheral circuit (for example, sense amplifier) will be exposed onto the other chip. Then, the stage having the wafer mounted thereon is moved by an amount corresponding to one chip and the next exposure process is effected. This operation is repeatedly effected and the cell array region A and peripheral circuit region B are exposed onto each of the chips. Therefore, the region of the exposure mask in which the pattern of the cell array and the pattern of a portion other than the cell array are formed is determined to correspond to the predetermined array pitch of the chips on the wafer.

By using the above exposure process in the bit line pattern forming process shown in FIG. 3, the depth of focus of 1.12 $\mu$m was obtained when the exposure latitude 10% was expected while the line width tolerance for a desired line width was suppressed to 10% or less in the cell array. Also, in the sense amplifier portion, the depth of focus 1.01 $\mu$m was obtained with the same specification.

(Sixth Embodiment)

Next, a different embodiment in which the exposure process is effected in a different illuminating condition depending on a pattern area on the mask is explained. As the pattern, the bit line patterns shown in FIG. 3 are used.

First, an exposure mask in which a cell array region A is formed of an alternating phase shifting mask and a peripheral circuit pattern other than the cell array is formed of an attenuated phase shifting mask is formed as follows.

Figure 22A:
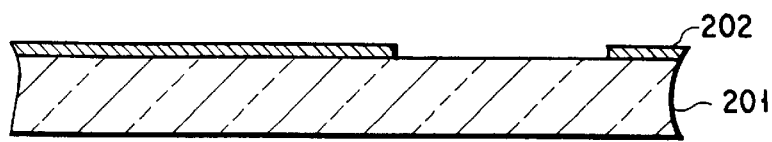
FIGS. 22A to 22G are cross sectional views of a mask showing a process in the order of the steps for forming an exposure mask according to a sixth embodiment.
Figure 22B:
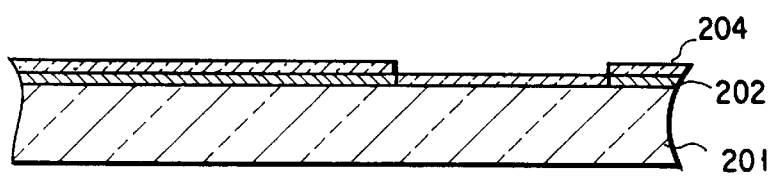

That is, the pattern of an opaque film 202 of Cr is formed to contain an area in which the peripheral circuit will be formed on a quartz substrate 201 as shown in FIG. 22A. Then, an attenuated film 204 is formed on the entire surface of the substrate as shown in FIG. 22B. In this case, the film formation process is effected by use of the sputtering method using an Si target and adjusting the flow rate of a mixture gas of ($Ar+O_2+N_2$) and an application voltage. By this method, an attenuated phase shifting mask 204 having a phase difference 182.7 degrees and light transmission 10% with respect to exposure light of 248 nm is formed.

Figure 22C:
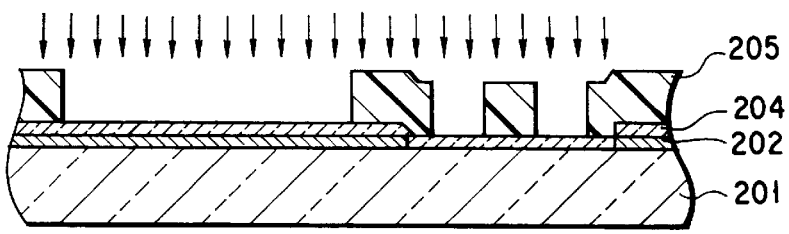
Figure 22D:
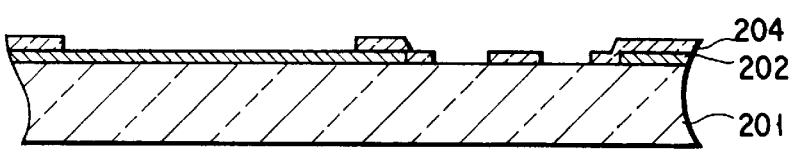

Next, as shown in FIG. 22C, a resist 205 is coated on the substrate and a peripheral circuit pattern and an opening pattern containing a cell array pattern forming region are formed by use of a laser drawing tool. Then, as shown in FIG. 22D, portions of the attenuated film exposed to the openings are etched and then the resist 205 is removed. The etching process is effected by use of a parallel plate RIE device and a mixture gas of ($HBr+SF_6+O_2$).

Figure 22E:
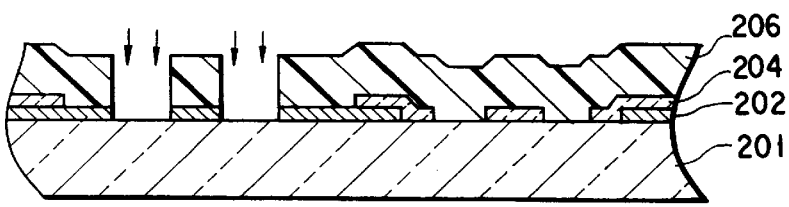

After this, as shown in FIG. 22E, a resist 206 is coated again and a cell array pattern is formed while the half-tone area corresponding to the peripheral circuit kept covered with the resist. Then, the resist 206 is used as an etching mask to selectively etch the Cr film 202. The etching process is effected by use of a parallel plate magnetron RIE device and a mixture gas of ($Cl_2+BCl_3+O_2$). After the etching process, the resist 206 is removed.

Figure 22F:
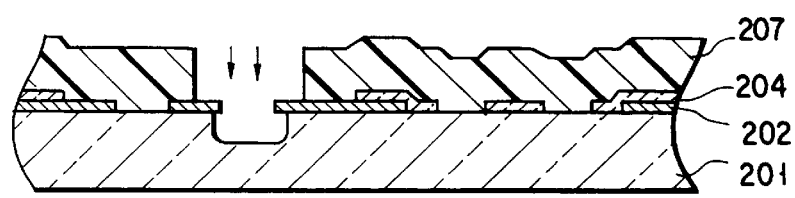

Next, as shown in FIG. 22F, a resist 207 is coated, a region containing an opening portion corresponding to the shifter portion of the cell array region is exposed and developed, and then the quartz substrate is engraved in the shifter portion by etching. The etching process is effected by use of an RIE device and a mixture gas of ($CF_4+SF_6+O_2$) and the wet etching process using a buffered hydrofluoric acid solution is additionally effected. In this case, the RIE process is effected to attain the depth 162 nm as a target value for the etching depth 244 nm which causes the phase difference 180 degrees when the exposure light wavelength 248 nm is used and the wet etching process is additionally effected to attain the depth 82 nm as a target value.

Figure 22G:
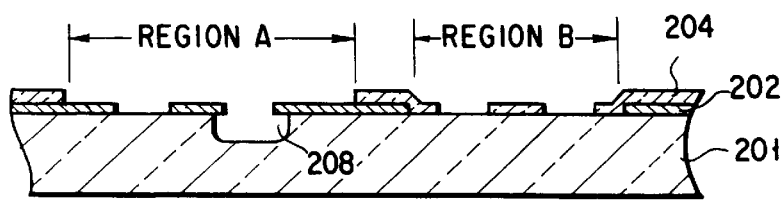

Next, as shown in FIG. 22G, the resist 207 is removed. The actual phase difference in the phase shifter portion 208 was measured and it was confirmed that the phase difference of 180.3 degrees was obtained.

Next, the wafer process and exposure method are explained.

A BPSG film is formed to a thickness of 0.8 $\mu$m by the CVD method on a wafer on which a structure obtained by a process up to a step before the bit line forming step is already formed. Then, the entire surface is etched and planarized by the CMP method. After this, an SiN film with a thickness of 0.1 $\mu$m is formed on the entire surface of the BPSG film by the low-pressure CVD method and a resist is coated. As the resist, a positive resist with a thickness of 0.2 $\mu$m is used.

After this, the cell array pattern formed as the alternating phase shifting mask on the exposure mask is sequentially aligned according to the chip arrangement of the semiconductor device previously formed on the wafer and then the first exposure process is effected. The illuminating condition is set such that NA=0.6, $\sigma$=0.3 and the exposure dose is 62 mJ/cm$^2$. The exposure process is effected for all of the chips one at a time. On the exposure device, a shutter mechanism for optically shielding part of the exposure mask is provided and the peripheral circuit region is masked by the shutter mechanism.

Next, the peripheral circuit pattern formed as the attenuated shifting mask is aligned according to the chip arrangement and the second exposure process is effected for each chip to transfer the peripheral circuit pattern onto the substrate. The second exposure condition is set such that NA=0.6, an annular illumination aperture having an outside diameter of 0.6, shielding an area which lies within the inside diameter of 0.4 and having the light shielding rate $\epsilon=\raisebox{0.5ex}{\scriptsize 2}/\raisebox{-0.5ex}{\scriptsize 3}$ as shown in FIG. 8B is used as the $\sigma$ aperture, and the exposure dose is 80 mJ/cm$^2$. At this time, the cell array region is masked by the shutter mechanism.

The above process is effected for 24 substrates of one lot while the substrates are sequentially replaced. The exposure of resist is sequentially effected for the substrates in the order in which they have been subjected to the exposure process, and then the baking and developing processes are effected to form resist patterns.

Next, the SiN film is etched by use of HBr gas with the resist used as an etching mask and then the BPSG film is etched by use of a mixture gas containing $C_4F_8$ gas. As a result, trench portions of the SiN film and BPSG film are formed in the wafer. Then, W is formed on the entire surface of the wafer containing the trench portions. After this, the entire surface portion is etched by the CMP method and the etching process is terminated when the SiN film is exposed. Thus, a structure in which W is filled only in the trench portions as bit lines is formed.

In this example, the positive resist is used as the resist, but another resist such as a silylation resist can be used.

An exposure mask forming method other than the above method is explained below.

After a structure shown in FIG. 22B is formed, an opaque film pattern of the cell array and a peripheral circuit pattern are formed on the resist 205 by use of a laser drawing tool as shown in FIG. 23A. Then, as shown in FIG. 23B, portions of the attenuated film 204 which are exposed to the openings are etched. Further, the Cr opaque film 202 is wet-etched by use of an etchant containing a cerium (II) nitrate ammonium solution and then the resist 205 is removed.

After this, as shown in FIG. 23C, a resist 206 is coated, and a region containing openings corresponding to the shifter portions of the cell array region is exposed to light and developed while the half-tone region corresponding to the peripheral circuit is kept covered with the resist 206, and then the quartz substrate is engraved by etching in the shifter portions.

Next, as shown in FIG. 23D, a resist 207 is coated after the resist 206 is removed, and a region containing the cell array region is exposed to light and developed and corresponding portions are exposed. Then, the exposed portions of the quartz substrate are etched and engraved and the attenuated film in the exposed area is removed by the CDE (Chemical Dry Etching) method using a mixture gas containing $CF_4$ gas. Finally, the resist is removed to complete the exposure mask shown in FIG. 23E.

Further, it is possible to use a method (a method for forming the opaque film on the attenuated film) for reversing the positional relation between the attenuated film and the opaque film used in the above method.

In the above embodiments, this invention is used for forming a DRAM memory cell, but this invention can also be applied to form an ASIC device having a DRAM, SRAM, EEPROM, and another type of semiconductor device having storage nodes. Specifically, this invention can be applied to a semiconductor device having a cell array having a repetitive pattern and a peripheral circuit pattern other than the cell array.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a semiconductor device comprising the steps of:
    preparing an exposure mask in which repeat pattern portions having shifter portions and non-shifter portions alternately and repeatedly arranged and non-repeat pattern portions having irregularly arranged patterns are separately formed in a plurality of regions of one exposure mask, light having passed through one of the shifter portions having a phase difference with respect to light having passed through one of the non-shifter portions adjacent to the one of the shifter portions;
    preparing a semiconductor wafer having a plurality of chip areas;
    aligning a pattern on one of the plurality of regions of the exposure mask with each of the plurality of chip areas on the semiconductor wafer;
    effecting an exposing process in an illuminating condition corresponding to the pattern on the one region, each time after aligning the pattern with each of the plurality of chip areas;
    aligning a pattern on a different one of the plurality of regions on the exposure mask with each of the plurality of chip areas on the semiconductor wafer; and
    effecting an exposing process in another illuminating condition corresponding to the pattern on the different one region, each time after aligning the pattern with each of the plurality of chip areas,
    wherein the step of effecting an exposing process corresponding to the pattern on the different one of the plurality of regions on the exposure mask is repeatedly effected until the exposing process for all of the plurality of regions of the exposure mask is completed.

2. A method for manufacturing a semiconductor device according to claim 1, wherein the plurality of regions are two regions, the step of effecting an exposing process corresponding to the pattern on the one region includes a step of sequentially exposing the plurality of chip areas, and the step of effecting an exposing process corresponding to the pattern on the different region includes a step of sequentially exposing the plurality of chip areas after the step of effecting an exposing process corresponding to the pattern on said one region.

3. A method for manufacturing a semiconductor device according to claim 1, wherein the repeat pattern portions include a memory cell array region and the non-repeat pattern portions include a sense amplifier region.

4. A method for manufacturing a semiconductor device according to claim 1, wherein the non-repeat pattern portions are formed in a translucent layer formed on a transparent substrate having a plurality of opening portions formed therein, each of the plurality of opening portions being combined with an adjacent portion of the translucent layer to constitute a phase shifter for substantially inverting the phase of the illumination light passing therethrough.

5. A method for manufacturing a semiconductor device according to claim 1, comprising:
    effecting said exposing process in said illuminating condition using at least one of a first numerical aperture and light having a first wavelength; and
    effecting said exposing process in said another illuminating condition using at least one of a second numerical aperture different from said first numerical aperture and light having a second wavelength different from said first wavelength, respectively.

6. A method for manufacturing a semiconductor device comprising the steps of:
    preparing an exposure mask in which repeat pattern portions having shifter portions and non-shifter portions alternately and repeatedly arranged and non-repeat pattern portions having irregularly arranged patterns are separately formed in a plurality of regions of one exposure mask, light having passed through one of the shifter portions having a phase difference with respect to light having passed through one of the non-shifter portions adjacent to the one of the shifter portions;
    preparing a semiconductor wafer having a plurality of chip areas;
    aligning a pattern on one of the plurality of regions of the exposure mask with one of the plurality of chip areas on the semiconductor wafer;
    exposing the pattern on the one region in an illuminating condition corresponding to the pattern on the one region;

aligning a pattern on a different one of the plurality of regions on the exposure mask with the one of the plurality of chip areas on the semiconductor wafer; and exposing the pattern on the different region in another illuminating condition corresponding to the pattern on the different one region, wherein the step of exposing the pattern on the different one of the plurality of regions on the exposure mask is repeatedly effected until an operation of exposing all of the plurality of regions of the exposure mask for the one of the plurality of chip areas is completed and then an exposure operation cycle is sequentially repeated for the plurality of chip areas.

7. A method for manufacturing a semiconductor device according to claim 6, wherein the plurality of regions are two regions, the step of exposing the pattern of said one region includes a step of exposing one of the plurality of chip areas, and the step of exposing the pattern of the different region includes a step of exposing the one of the plurality of chip areas after the step of exposing the pattern of the one region.

8. A method for manufacturing a semiconductor device according to claim 6, wherein the repeat pattern portions include a memory cell array region and said non-repeat pattern portions include a sense amplifier region.

9. A method for manufacturing a semiconductor device according to claim 6, wherein the non-repeat pattern portions are formed in a translucent layer formed on a transparent substrate having a plurality of opening portions formed therein, each of the plurality of opening portions being combined with an adjacent portion of the translucent layer to constitute a phase shifter for substantially inverting the phase of the illumination light passing therethrough.

10. A method for manufacturing a semiconductor device according to claim 6, comprising:

exposing the pattern on the one region in said illuminating condition using at least one of a first numerical aperture and light having a first wavelength; and exposing the pattern on the different region in said another illuminating condition using at least one of a second numerical aperture different from said first numerical aperture light having a second wavelength different from said first wavelength, respectively.

11. A method for manufacturing a semiconductor device comprising the steps of:

preparing a plurality of first exposure masks having repeat pattern portions with shifter portions and non-shifter portions alternately and repeatedly arranged and a plurality of second exposure masks having non-repeat pattern portions with irregularly arranged patterns, where light having passed through one of the shifter portions having a phase difference with respect to light having passed through one of the non-shifter portions adjacent to the one of the shifter portions;

preparing a plurality of semiconductor wafers each having a plurality of chip areas;

sequentially aligning one pattern in the plurality of first exposure masks with the plurality of chip areas on the plurality of semiconductor wafers;

exposing the pattern in the plurality of first exposure masks in an illuminating condition corresponding to the pattern;

sequentially aligning one pattern in the plurality of second exposure masks with the plurality of chip areas on the plurality of semiconductor wafers; and exposing the pattern in the plurality of second exposure masks in another illuminating condition corresponding to the pattern, wherein the step of exposing the pattern in the plurality of first exposure masks and the step of exposing the pattern in the plurality of second exposure masks are repeatedly effected by the number of times respectively equal to the number of the first exposure masks and number of the second exposure masks.

12. A method for manufacturing a semiconductor device according to claim 11, wherein the repeat pattern portions include a memory cell array region and the non-repeat pattern portions include a sense amplifier region.

13. A method for manufacturing a semiconductor device according to claim 11, wherein the non-repeat pattern portions are formed in a translucent layer formed on a transparent substrate having a plurality of concave portions formed therein, each of the plurality of opening portions being combined with an adjacent portion of the translucent layer to constitute a phase shifter for substantially inverting the phase of the illumination light passing therethrough.

14. A method for manufacturing a semiconductor device according to claim 11, wherein the step of exposing the pattern in the plurality of first exposure masks includes a step of sequentially exposing the plurality of chip areas of one of the plurality of semiconductor wafers and then terminating an exposing cycle, and said step of exposing the pattern in the plurality of second exposure masks includes a step of sequentially exposing the plurality of chip areas of one of the plurality of semiconductor wafers and then terminating an exposing cycle.

15. A method for manufacturing a semiconductor device according to claim 11, wherein the step of exposing the pattern in the plurality of first exposure masks includes a step of repeatedly effecting sub-cycles for sequentially exposing the plurality of chip areas of one of the plurality of semiconductor wafers by the number of times equal to the number of the semiconductor wafers and then terminating an exposing cycle, and the step of exposing the pattern in the plurality of second exposure masks includes a step of repeatedly effecting sub-cycles for sequentially exposing the plurality of chip areas of one of the plurality of semiconductor wafers by the number of times equal to the number of the semiconductor wafers and then terminating an exposing cycle.

16. A method for manufacturing a semiconductor device according to claim 11, wherein the step of exposing the pattern in the plurality of first exposure masks and said step of exposing the pattern in the plurality of second exposure masks are continuously effected for each of the plurality of chip areas by the number of the plurality of the first exposure masks and the number of the plurality of the second exposure masks.

17. A method for manufacturing a semiconductor device according to claim 11, comprising:

exposing the pattern in the plurality of first exposure masks in said illuminating condition using light of a first wavelength; and exposing the pattern in the plurality of second exposure masks in said another illuminating condition using light having a second wavelength different from said first wavelength.

18. A method for manufacturing a semiconductor device comprising the steps of:

preparing a semiconductor wafer having a plurality of chip areas;

preparing an exposure mask formed to cause repeat pattern portions having shifter portions and non-shifter portions alternately and repeatedly arranged and non-repeat pattern portions having irregularly arranged patterns to be projected on different ones of the plurality of chip areas on the semiconductor wafer, light having passed through one of the shifter portions having a phase difference with respect to light having passed through one of the non-shifter portions adjacent to the one of the shifter portions and a diffraction grating pattern being provided in a region corresponding to the non-repeat pattern portions; and simultaneously exposing the repeat pattern portions and the non-repeat pattern portions of the exposure mask to the different ones of the plurality of chip areas of the semiconductor wafers, wherein the repeat pattern portions and the non-repeat pattern portions are exposed to preset areas among substantially all of the plurality of chip areas by repeatedly effecting the exposing step to expose the repeat pattern portions onto substantially all of the plurality of chip areas.

19. A method for manufacturing a semiconductor device according to claim 18, wherein the repeat pattern portions include a memory cell array region.

20. A method for manufacturing a semiconductor device comprising the steps of:

preparing an exposure mask in which a plurality of island-form opening patterns are regularly arranged and an optical path difference of approximately ½ of a wave length $\lambda$ of an exposure light is provided for each of adjacent opening patterns;

forming a semiconductor element on a semiconductor substrate;

forming an insulating film on the semiconductor substrate having the semiconductor element formed thereon;

forming a positive type resist layer on the insulating film;

exposing the resist layer via a pattern of the exposure mask and developing the same to form a resist pattern;

selectively etching the insulation film to form trenches by using the resist pattern as a mask; and filling a wiring material in the trenches of the insulating film.

21. A method for manufacturing a semiconductor device comprising the steps of:

preparing an exposure mask having an alternating phase shift region and a non-alternating phase shift region;

exposing a first portion of each of a plurality of chip areas on a semiconductor wafer with only said phase shift region of said exposure mask in a first illuminating condition; and exposing a second portion, different than said first portion, of each of said plurality of chip areas with only said non-alternating phase shift region of said exposure mask in a second illuminating condition different from said first illumination condition.

* * * * *